United States Patent [19]
Suzuki et al.

[11] Patent Number: 5,644,156
[45] Date of Patent: Jul. 1, 1997

[54] POROUS SILICON PHOTO-DEVICE CAPABLE OF PHOTOELECTRIC CONVERSION

[75] Inventors: Taketoshi Suzuki, Tokyo; Tadashi Sakai, Yokohama; Li Zhang, Tokyo; Taijun Murakami, Yokohama, all of Japan

[73] Assignee: Kabushiki Kaisha Toshiba, Kawasaki, Japan

[21] Appl. No.: 420,515

[22] Filed: Apr. 12, 1995

[30] Foreign Application Priority Data

Apr. 14, 1994 [JP] Japan ............... 6-075665
Sep. 19, 1994 [JP] Japan ............... 6-223656
Mar. 23, 1995 [JP] Japan ............... 7-063745

[51] Int. Cl.$^6$ .......... H01L 27/095; H01L 29/47; H01L 29/812; H01L 31/07
[52] U.S. Cl. .......... 257/485; 257/3; 257/309; 257/618; 257/647
[58] Field of Search .......... 257/3, 309, 485, 257/618, 647

[56] References Cited

U.S. PATENT DOCUMENTS 5,068,199  11/1991  Sandhu .................. 437/52
5,372,962  12/1994  Hirota et al. ........... 437/47
5,445,986   8/1995  Hirota .................. 437/60
5,488,015   1/1996  Havemann et al. ........ 437/195
5,508,542   4/1996  Geiss et al. ........... 257/301
5,527,737   6/1996  Jeng ................... 437/195

FOREIGN PATENT DOCUMENTS 6-140669  5/1994  Japan.
6-163968  6/1994  Japan.

OTHER PUBLICATIONS

Appl. Phy. Lett; 62(16); A.J. Steckl, et al.; Apr. 19, 1993, pp. 1982–1984 "Doping–Induced Selective Area Photoluminescence in Porous Silicon".

*Primary Examiner*—Ngân V. Ngô
*Attorney, Agent, or Firm*—Oblon, Spivak, McClelland, Maier & Neustadt, P.C.

[57] ABSTRACT

A semiconductor device includes a porous silicon layer with an impurity concentration of $1\times10^{19}$ to $1\times10^{21}$ cm$^{-3}$, in which a plurality of pores are formed, and a thermal oxide film 0.01 to 10 μm thick formed on the expanded surfaces of the porous silicon layer, wherein said expanded surfaces include internal surface of said pores.

9 Claims, 24 Drawing Sheets

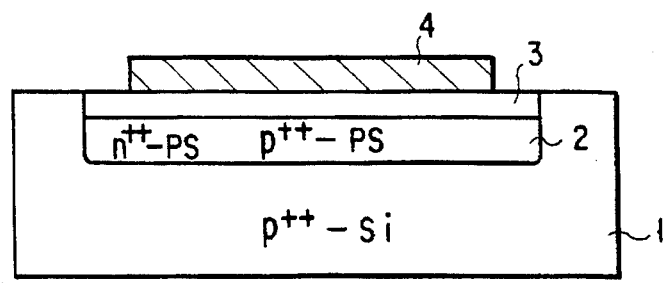
F I G. 1
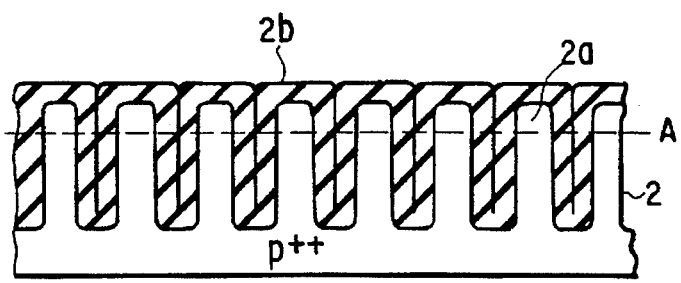
F I G. 2A
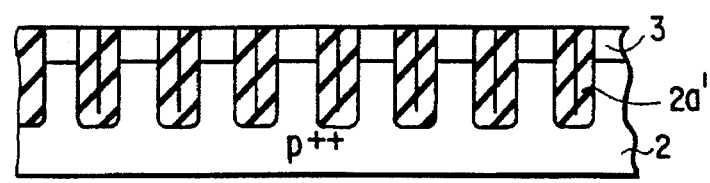
F I G. 2B
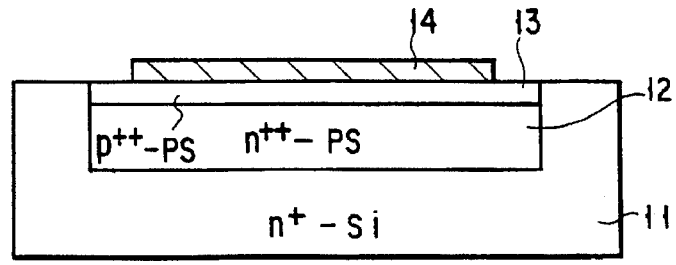
F I G. 3
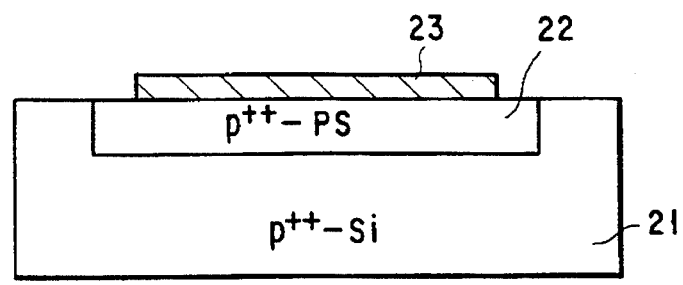
F I G. 4

F I G. 5
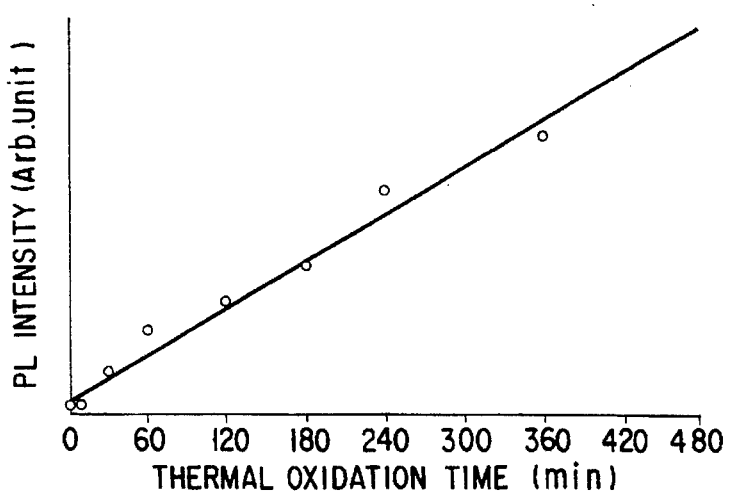
F I G. 7
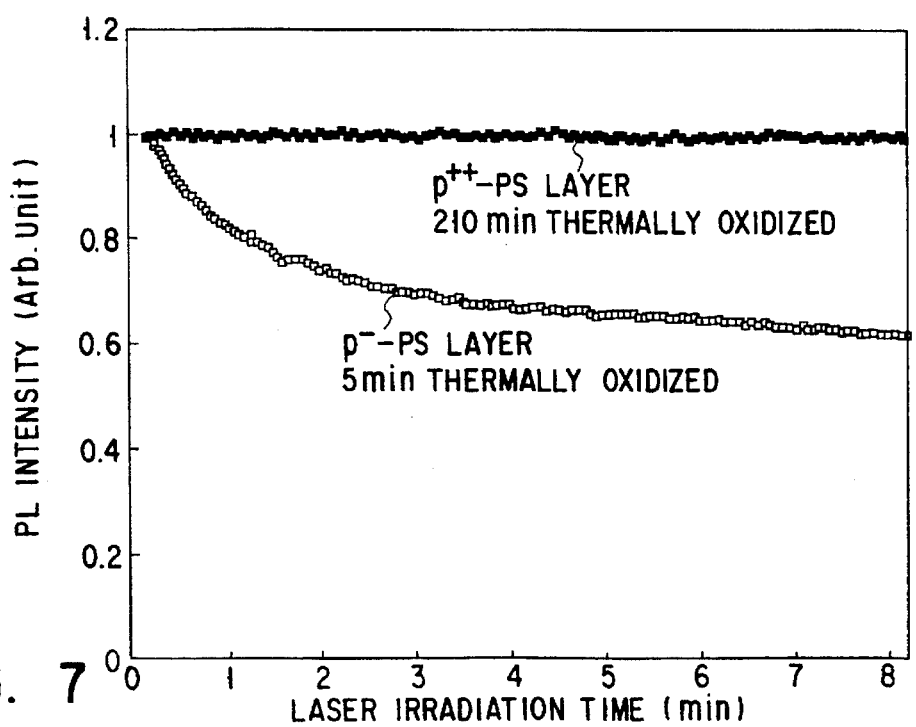

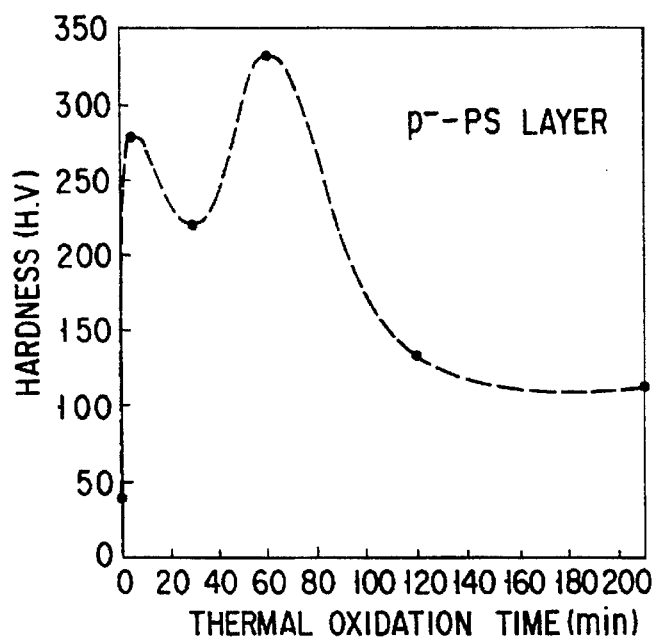
F I G. 8
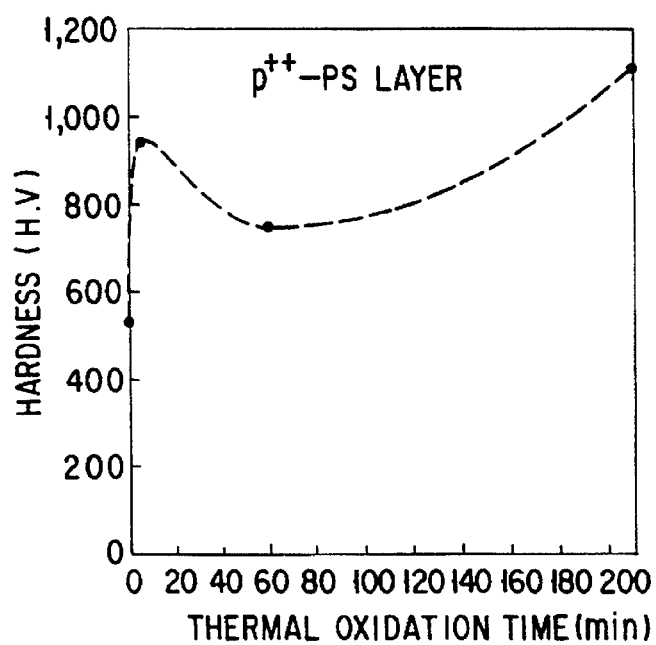
F I G. 9

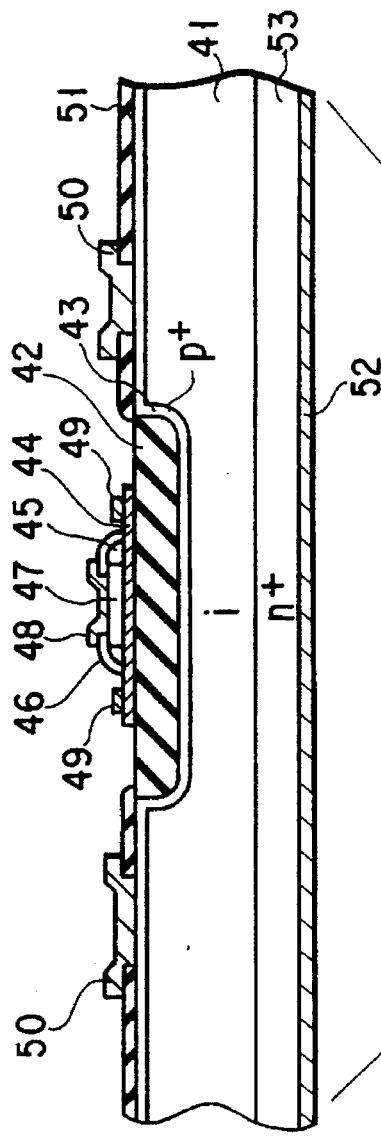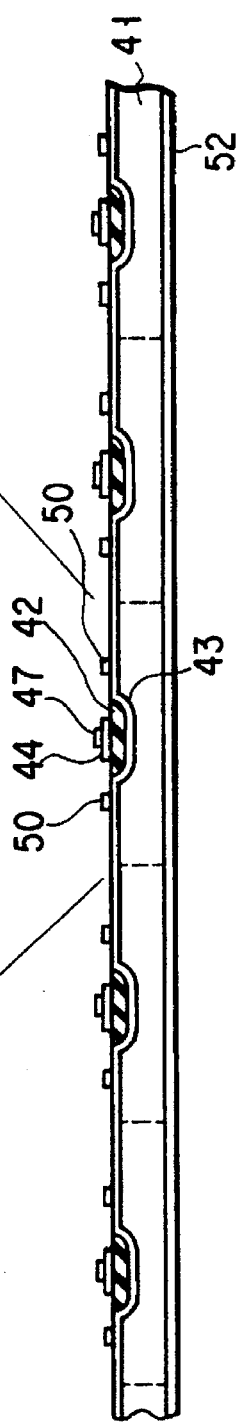
FIG. 10A
FIG. 10B

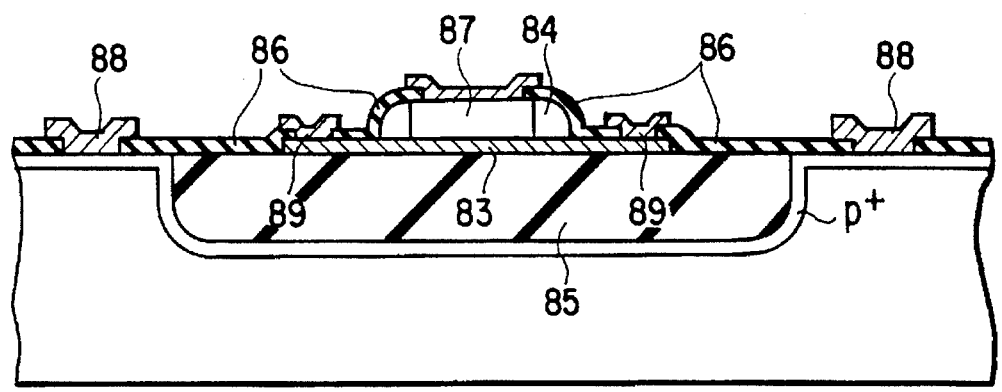
F I G. 12
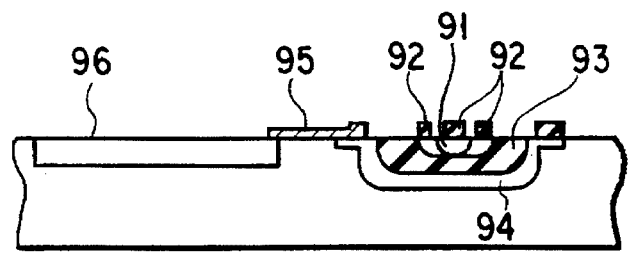
F I G. 13
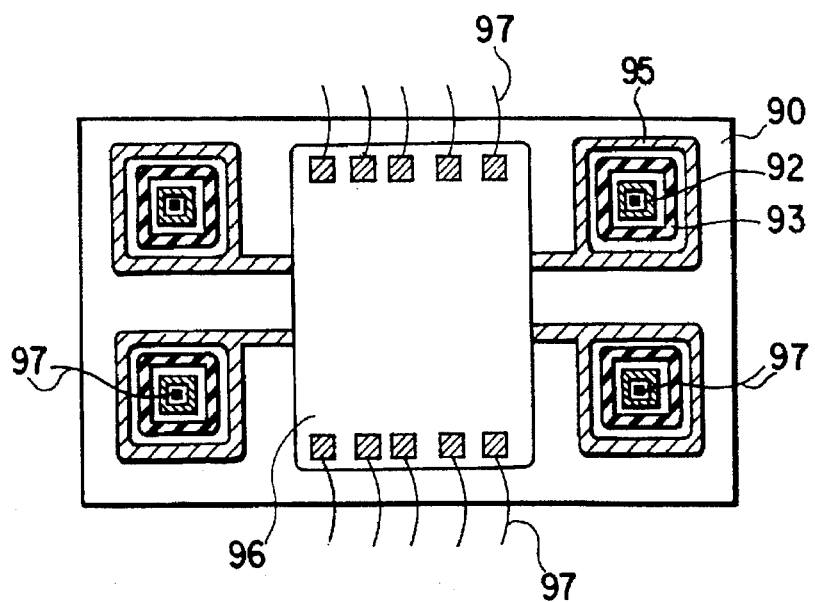
F I G. 14

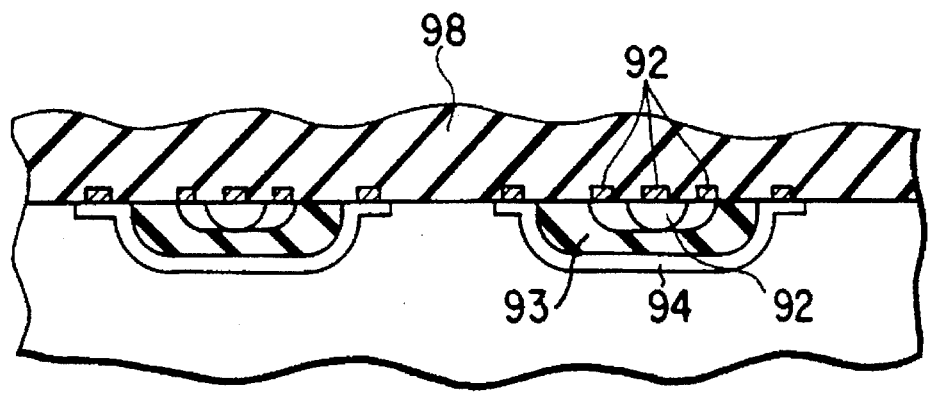
F I G. 15
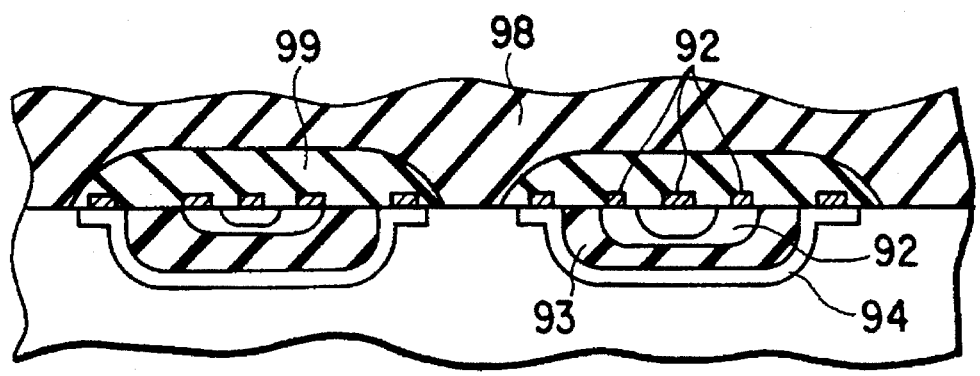
F I G. 16

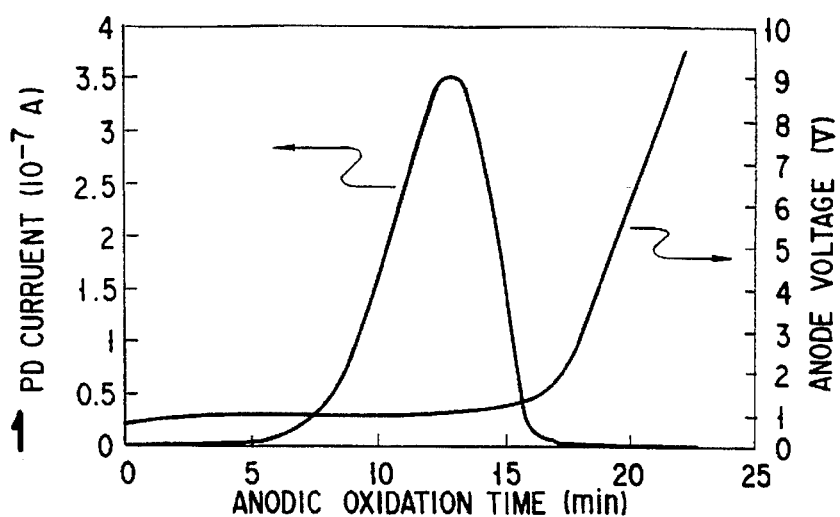
F I G. 21
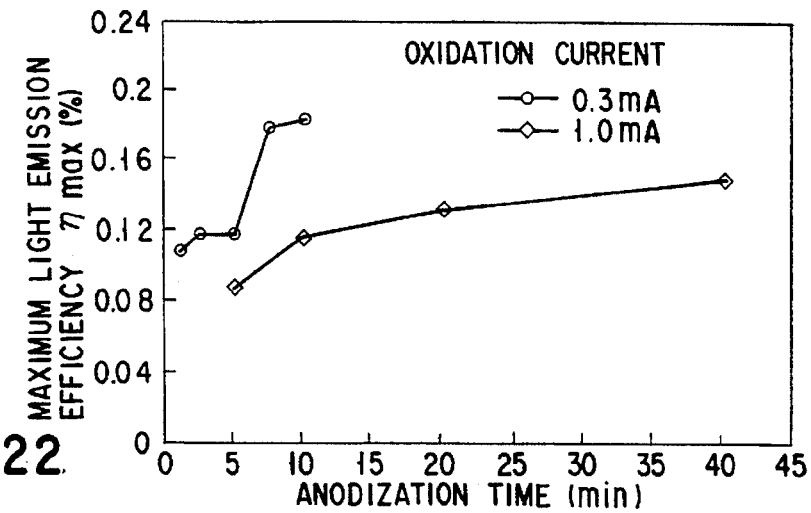
F I G. 22
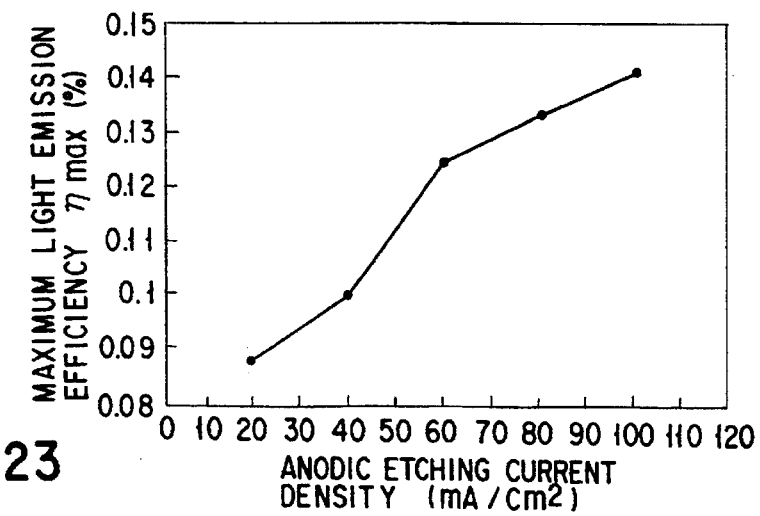
F I G. 23

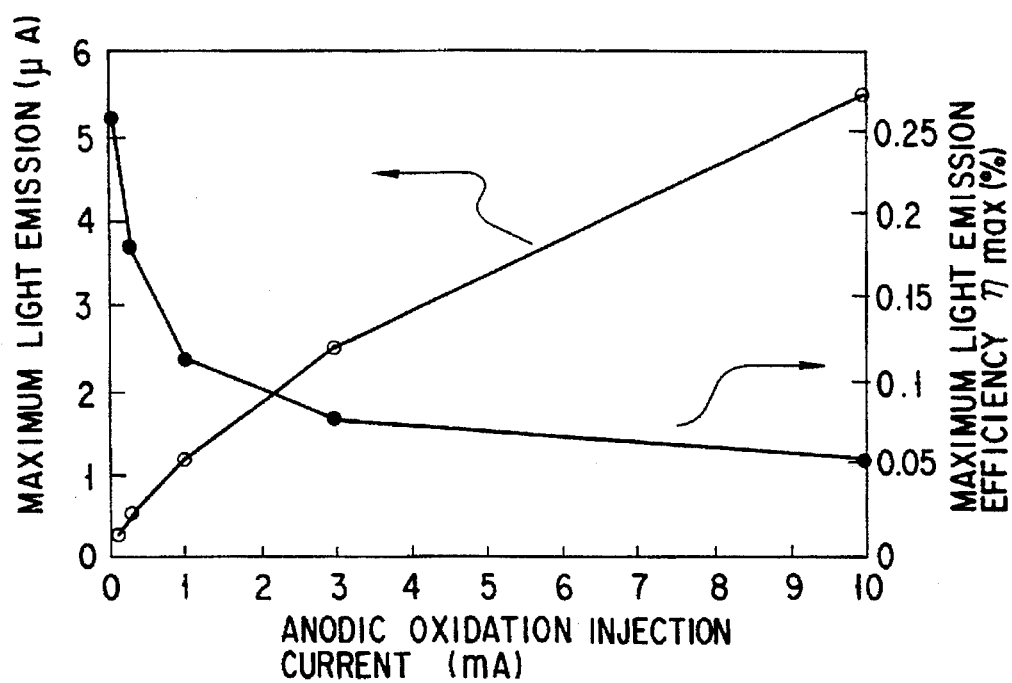
F I G. 24
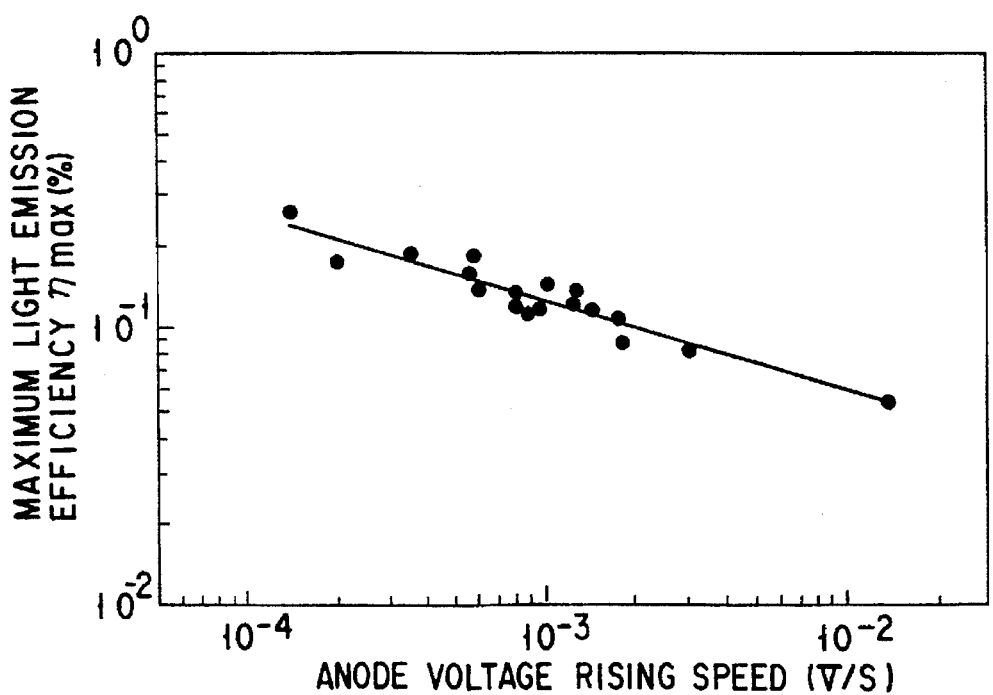
F I G. 25

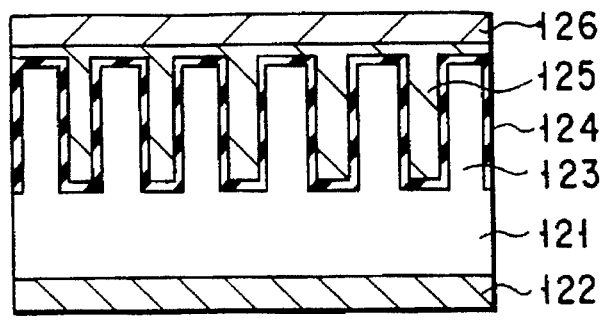
F I G. 30
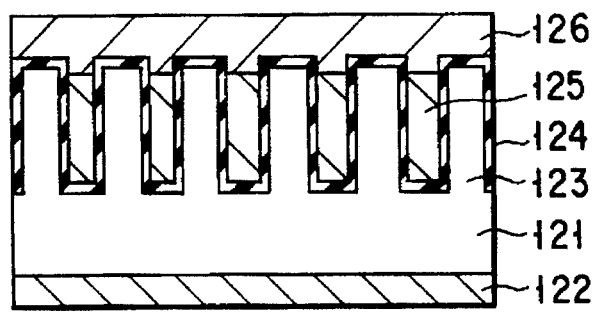
F I G. 31
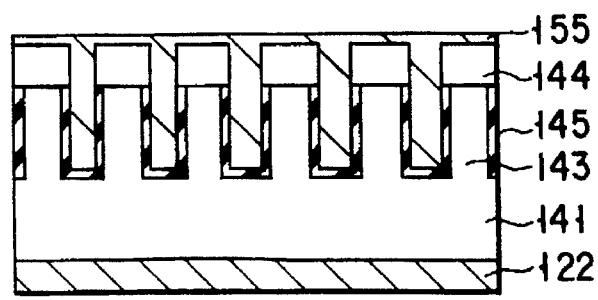
F I G. 33

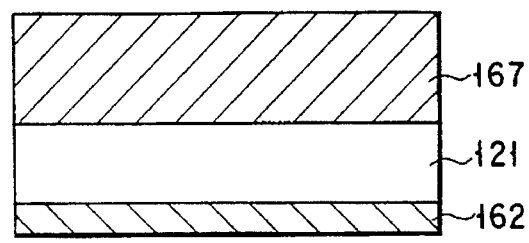
F I G. 34A
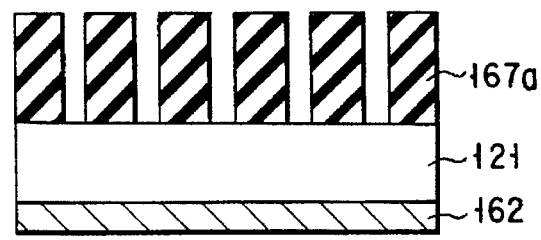
F I G. 34B
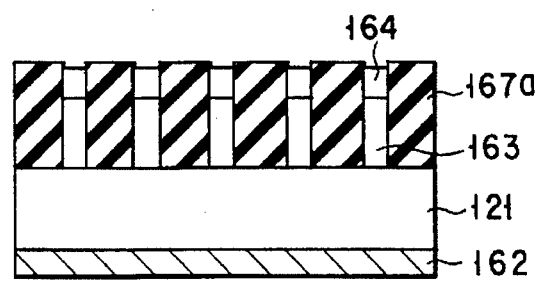
F I G. 34C
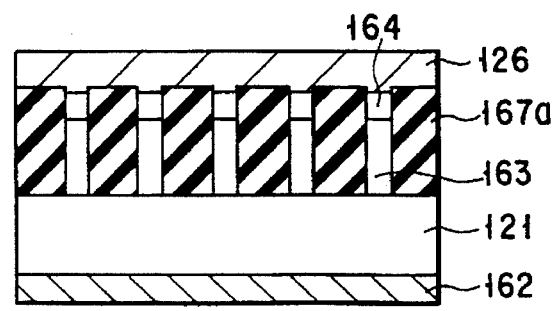
F I G. 34D

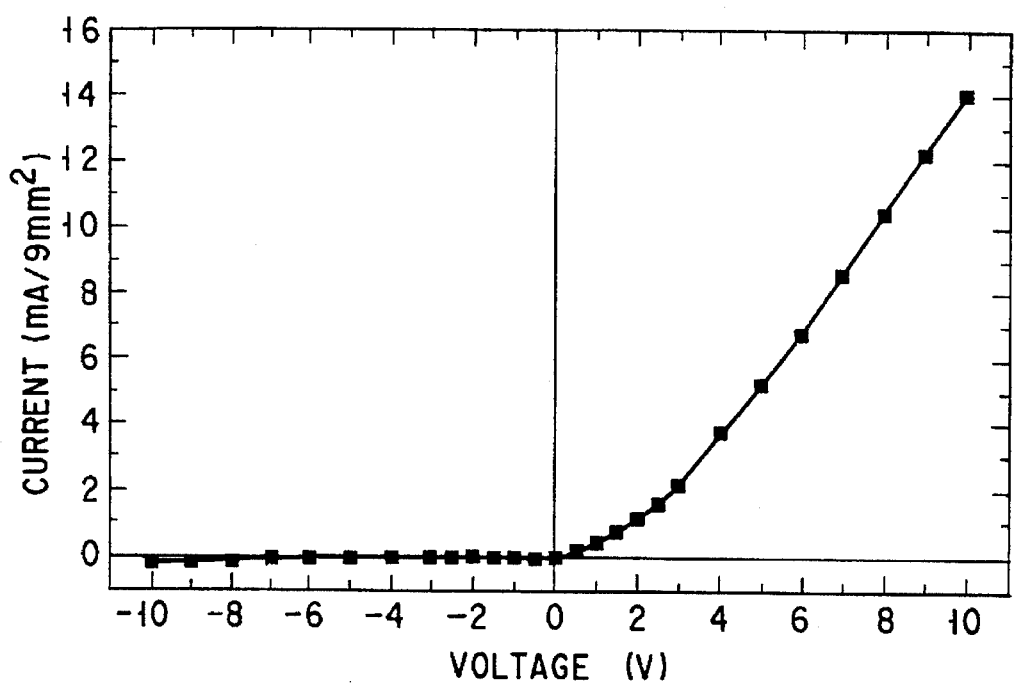
F I G. 40
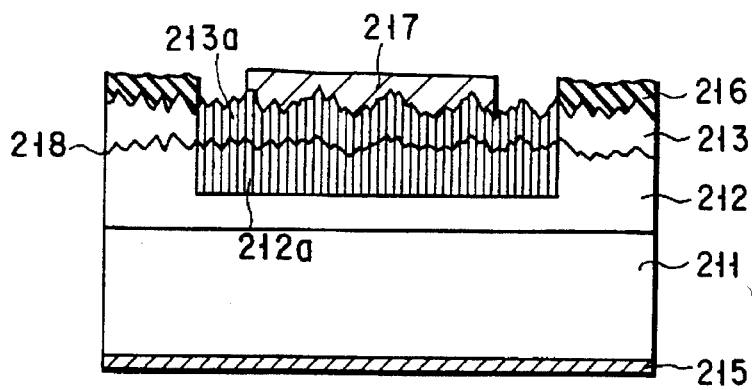
F I G. 41

POROUS SILICON PHOTO-DEVICE CAPABLE OF PHOTOELECTRIC CONVERSION

BACKGROUND OF THE INVENTION

1. Field of the Invention

The present invention relates to a semiconductor device and, more particularly, to a porous silicon photo-device using porous silicon.

2. Description of the Related Art

Semiconductors such as Si and Ge that are group IV elements of the periodic table are essentially indirect transition semiconductors and hence have been conventionally thought of as capable of only nonluminescent transition. However, in recent years it has turned out that even these semiconductors show luminescent transition characteristics when they are made porous and given a micro-structure by means of, e.g., anodization. EL (ElectroLuminescence) devices fabricated by using these indirect transition semiconductors having a micro-structure are attracting a great deal of attention, since these devices luminesce at low luminescence threshold voltages. Therefore, research and development of these EL devices are being extensively done.

By convention, the basic arrangement of the EL devices as discussed above consists of a semiconductor device fabricated by stacking a luminescing semiconductor layer having a micro-structure (porous structure) and a conductive layer into which an electric charge is injected. The conductive layer is made from Au, ITO, or SiC and stacked on a layer of Si or Ge by using a thin film formation technique such as vapor deposition or sputtering. It is already confirmed that these devices luminesce, albeit very weakly, upon application of a voltage of several volts or higher. Also, some researchers are pursuing a method in which a p-n junction is formed in a semiconductor layer and made porous to have a micro-structure, thereby making both electrons and holes simultaneously present in this micro-structure. In this method luminescence is caused by recombination of these electrons and holes in the micro-structure.

The light emission efficiency of these EL devices is low compared to that of PL (PhotoLuminescence) which is obtained by directly irradiating exciting light. The stability of the luminescence of the EL device is also unsatisfactory. Additionally, the electrical conductivity of the EL device is low since the electrical resistance of the device itself is high. To use the EL devices as photoelectric conversion devices in the future, therefore, this low electrical conductivity will be troublesome because these devices are supposed to handle high-speed signals. One cause of these problems is the lack of mechanical strength of the device. That is, in order to increase the light emission efficiency, it is necessary to increase the porosity of a portion of a semiconductor which is given a micro-structure. Accordingly, the mechanical strength of this micro-structure decreases significantly. As a consequence, cracks are often formed on the surface of the device in operation, or the device causes uneven luminescence in many instances. In some cases the semiconductor device is used as another device such as a rectifier device. In these instances the low mechanical strength results in unstable current-voltage characteristics of the device, if a charge injection layer is formed by vapor deposition or sputtering.

A cause of these drawbacks of the porous silicon device is considered as follows. That is, when the surface of a silicon substrate is made porous by, e.g., anodization, to form a silicon micro-skeleton consisting of a number of silicon wires, and when the resultant surface is exposed to the air, a natural oxide film is formed on the silicon wires and at the same time the silicon wires deform and aggregate. This decreases the mechanical strength of the micro-skeleton and also makes the charge injection layer formed on it nonuniform. Consequently, the light emission efficiency decreases, and the stability of luminescence becomes unsatisfactory. The electrical conductivity also lowers.

As discussed above, the basic form of the light-emitting device using porous silicon having a micro-skeleton as a base is the structure in which a light-transmitting charge injection layer is stacked on the porous silicon. That is, the device is a heterojunction device fabricated by stacking an n-type semiconductor, such as ITO (Indium Tin Oxide), on a p-type porous layer. Examples of this heterojunction device are a device in which the electrode is constructed of a semi-transparent metal, and a device in which a polymer is formed by electrolytic polymerization. It is unfortunate that neither of these devices has a sufficient light emission efficiency; the light emission efficiency is at most $10^{-6}$ to $10^{-4}\%$. One possible method by which this is improved is to form a homo p-n junction of the porous silicon. Several attempts have been made to achieve this method. As an example, in Fraunhofer-Institute in Germany a p-type layer was formed on the surface of n-type silicon and a p-n junction was formed by irradiation of light (W. Lang et al., "Porous silicon light-emitting p-n junction", Journal of Luminescence 57 (1993), pp. 169–173). Unfortunately, by this method the surface is a p-type layer and this makes it impossible to combine the device with an ITO film which is effective as a light-transmitting charge injection layer. This is because ITO is of n-type and hence forms a p-n junction with the surface of the p-type layer, with the result that an n-p-n junction is formed by this p-n junction and the internal junction. IBM Corp. has reported a method in which a p-n junction is formed by forming an n-type silicon layer on a p-type silicon layer and is selectively etched to form a number of mesa regions in which the p-n junction surface is exposed, and the underlying p-type layer is selectively made porous to form a pseudo p-n junction (E. Bassous et al., "Characterization of Microporous Silicon fabricated by Immersion Scanning", Mat. Res. Soc. Symp. Proc. Vol. 256, pp. 23–26). In this method, however, the resultant p-n junction is essentially a heterojunction since the overlying n-type layer is made from bulk silicon, so only a low light emission efficiency can be attained.

To solve these problems, it is only necessary to obtain a homo junction having an n-type porous layer on the surface and a p-type porous layer as the underlying layer. Unfortunately, it is very difficult to form this structure such that the structure is uniform and both the n-type and the p-type layers are suitable for luminescence. More specifically, it is assumed possible to form a junction of porous silicon while well controlling the depth and the impurity concentration, by forming an n-type layer on the surface of p-type bulk silicon by impurity diffusion and anodizing the resultant structure from the surface. However, by this method the anodization does not uniformly proceed, i.e., the anodization is concentrated in a portion of the anodized region. The result is a nonuniform junction structure in which the p-type porous layer is formed in a portion below the n-type porous silicon layer. The reason for this is considered that since the anodization reaction originally requires holes, the p-type layer having a large number of holes is readily anodized significantly, and consequently the anodization selectively proceeds in a portion where the anodization has first reached the underlying p-type layer. For this reason, the resultant junction luminesces only nonuniformly, so it is not possible to obtain satisfactory performance.

The heterojunction device is also considered as a Schottky junction between porous silicon and, e.g., ITO or Au. Therefore, no large current flows unless the thermoelectronic emission is increased. Consequently the bias voltage needs to be set higher than the Schottky barrier. If the current is increased, an energy loss caused by a high series resistance increases, and this makes high-efficiency luminescence difficult.

In addition, when a p-n junction of a porous semiconductor is formed by making a p-n junction substrate porous, the morphological structure of the porous silicon in the p-type region differs from that in the n-type region. Consequently, the band gap in the p-type layer is also different from that in the n-type layer. For that reason, only p-n hetero-junctions have been realized to date. In particular, it is difficult to fabricate a micro-structure which emits visible light by using heavily doped silicon as a p-type layer. The resistance of porous silicon fabricated on a low-resistance substrate is further increased when the silicon is made porous. As discussed above, p-n junction devices using conventional porous semiconductors are actually p-n heterojunction devices in which the resistance of the light-emitting layer is high. Therefore, no p-n junction devices having satisfactory electrical characteristics and luminescence characteristics have been obtained yet.

Incidentally, various types of optical semiconductor elements (to be referred to as photoelectric conversion elements hereinafter) which receive light and output a current or a voltage have been developed and put into practical use. In devices such as photocouplers requiring integration, photoelectric conversion elements (silicon photoelectric conversion elements) such as photodiodes or phototransistors using silicon, among other photoelectric conversion elements, have been extensively used because of good matching properties with an output processing circuit or with some other peripheral device and a high quantum efficiency. Various structures are known as the structure of the silicon photoelectric conversion element. Examples are a p-n junction, a p-i-n junction, and a metal silicon Schottky junction. The light reception characteristics and the junction depth of these photoelectric conversion elements are controlled by adjusting the impurity concentration. Consequently, photoelectric conversion elements having different light reception wavelength sensitivity peaks are being fabricated.

Usually, the region of the light reception sensitivity of the silicon photoelectric conversion element is in the region of a wavelength longer than 0.6 µm. The sensitivity of devices most widely used as the light-receiving element is in a wavelength region of approximately 0.9 µm (regions from the visible region to the infrared region). Therefore, silicon photoelectric conversion elements usable as the light-receiving element of a photocoupler are restricted to those having a luminescence wavelength in regions from the visible region to the infrared region. For this reason, Si-doped compounds such as GaAs, GaAsP, and GaAlAs are used as the material of the light-emitting element. These materials are entirely different from the materials of the silicon photoelectric conversion elements. Therefore, in the manufacture of a photocoupler the light-receiving element and the light-emitting element are formed independently. The light-receiving elements and the light-emitting elements thus fabricated are mounted on lead frames or the like, and these lead frames are so assembled as to oppose each other in a so-called coupling step. Subsequently, a transparent silicone resin or the like material is filled between these light-emitting and light-receiving elements, and the coupled elements are transfer-molded with a white epoxy resin.

It is unfortunate that conventional photocouplers as discussed above have the problem of a high manufacturing cost resulting from a cumbersome coupling step. In addition, this coupling step is the major cause of variations in the optical coupling efficiency between the light-receiving and light-emitting elements. This is so because it is unavoidable that the positions slightly deviate in each of the steps of die-bonding the elements to the lead frames, assembling the lead frames to oppose each other, and bonding the individual elements to insulating spacers. This positional deviation is the principal cause of variations in the optical coupling efficiency between the light-receiving and light-emitting elements.

To solve these problems, several couplingless, monolithic photocouplers have been proposed. Unfortunately, none of these monolithic photocouplers has satisfactory performance. In addition, many of these monolithic photocouplers are fabricated by stacking a light-receiving element, an insulating layer, and a light-emitting element by using a thin film formation method. However, by this method the insulating layer cannot have a large thickness, so it is impossible to impart the device a high dielectric withstand voltage.

Furthermore, in some monolithic photocouplers a light-receiving element and a light-emitting element are formed on both surfaces of a thick insulating layer such as glass. In the case of monolithic photocouplers of this type, however, a plurality of input and output electrodes connected to these elements are formed on both of the front and back sides of the substrate. This results in an extremely complicated mounting process.

Moreover, some monolithic photocouplers have a structure in which a mirror is formed on one surface of a thick glass substrate, light-receiving and light-emitting elements are arranged on the same surface, and light is reflected by the mirror to accomplish optical coupling. Unfortunately, in monolithic photocouplers of this sort the optical coupling efficiency is significantly low.

SUMMARY OF THE INVENTION

It is an object of the present invention to provide a porous silicon semiconductor device with mechanical strength and light emission intensity by which the device can be put into practical use.

It is another object of the present invention to provide a porous silicon photo-device capable of photoelectric conversion over a wavelength range broader than that of conventional silicon photoelectric conversion devices.

To achieve the above objects, a semiconductor device according to the first aspect of the present invention comprises:

a porous silicon layer with an impurity concentration of $1 \times 10^{19}$ to $1 \times 10^{21}$ cm$^{-3}$, in which a plurality of pores are formed; and a thermal oxide film 0.01 to 10 µm thick formed on expanded surfaces of the porous silicon layer, the expanded surfaces including internal surfaces of the pores.

A desirable mode of the above invention is a semiconductor device comprising:

a silicon substrate having a major surface;

a first porous silicon layer of a first conductivity type with an impurity concentration of $1\times10^{19}$ to $1\times10^{21}$ cm$^{-3}$, which is formed on the major surface of the silicon substrate, and in which a plurality of pores are formed;

a second porous silicon layer of a second conductivity type with an impurity concentration of $1\times10^{19}$ to $1\times10^{21}$ cm$^{-3}$, in which a plurality of pores are formed and which are formed on the first silicon layer to form a p-n junction with the first silicon layer; and a thermal oxide film 0.01 to 10 μm thick formed on expanded surfaces of the first and second silicon layers, the expanded surfaces including internal surfaces of the pores; and an electrode selectively formed on the second porous silicon layer of the second conductivity type.

The electrode is preferably a transparent electrode and the p-n junction preferably has a luminescent function. The p-n junction is preferably formed by forming a porous silicon layer of the first conductivity type and doping an impurity of the second conductivity type from the upper surface of the porous silicon layer.

A semiconductor device according to the second aspect of the present invention comprises:

a substrate having a major surface;

a light-emitting element formed on the major surface;

a photoelectric conversion element formed in correspondence with the light-emitting element, the photoelectric conversion element converting light into electricity; and a thermally oxidized porous silicon layer so formed between the light-emitting element and the photoelectric conversion element as to surround the light-emitting element from the inside to the surface of the substrate.

A desirable mode of this invention is a semiconductor device comprising:

a substrate having a major surface;

a plurality of light-emitting elements formed on the major surface;

a plurality of thermally oxidized porous silicon layers so formed as to surround the light-emitting elements from the inside of the substrate; and a plurality of photoelectric conversion elements formed inside the substrate in a one-to-one correspondence with the light-emitting elements via the thermally oxidized porous silicon layers, wherein light emitted from each of the light-emitting elements enters a corresponding one of the photoelectric conversion elements through a corresponding one of the thermally oxidized porous silicon layers.

The light-emitting elements preferably have a porous silicon layer with an impurity concentration of $1\times10^{19}$ to $1\times10^{21}$ cm$^{-3}$.

The photoelectric conversion elements are preferably pin-type semiconductor elements. The thermally oxidized porous silicon layers preferably contain transparent insulating members made from, e.g., a silicone resin, silicate glass and so forth.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a sectional view of the semiconductor device according to the first embodiment of the present invention;

FIGS. 2A and 2B are enlarged sectional views of a P$^{++}$-type porous silicon layer 2 shown in FIG. 1, in which FIG. 2A illustrates the state immediately after a thermal oxide film is formed on the porous silicon layer 2, and FIG. 2B illustrates the state in which a portion above the line A—A is etched off and a p-n junction is formed by ion implantation of an n-type impurity from the upper surface;

FIG. 3 is a sectional view of the semiconductor device according to the second embodiment of the present invention;

FIG. 4 is a sectional view of the semiconductor device according to the third embodiment of the present invention;

FIG. 5 is a graph showing the relationship between the thermal oxidation time and the PL intensity of the photo-device according to the present invention;

FIG. 7 is a graph showing the comparison between a change in the PL intensity with respect to the laser irradiation time of a photo-device having a P$^{++}$-type porous silicon layer which is thermally oxidized for 210 min. with that of a photo-device having a p$^-$-type porous silicon layer which is thermally oxidized for 5 min.;

FIG. 8 is a graph showing the relationship between the thermal oxidation time and the hardness of a p$^-$-type porous silicon layer;

FIG. 9 is a graph showing the relationship between the thermal oxidation time and the hardness of a P$^{++}$-type porous silicon layer;

FIGS. 10A and 10B are sectional views of the photocoupler according to the fourth embodiment of the present invention, in which FIG. 10B is a sectional view of a wafer on which a plurality of couplers are formed, and FIG. 10A is an enlarged sectional view of one of these devices;

FIG. 12 is a sectional view of a photocoupler which is a modification of the fourth embodiment and in which a reflecting layer is formed on the surface of a substrate;

FIG. 13 is a schematic sectional view of an optical integrated circuit in which a photocoupler and its signal processing circuit are integrally formed;

FIG. 14 is a plan view showing the concept of the optical integrated circuit in FIG. 13;

FIG. 15 is a sectional view of a photocoupler fabricated by forming a light leakage inhibiting film on the surface of the photocoupler of the fourth embodiment;

FIG. 16 is a sectional view of a photocoupler fabricated by forming a light-reflecting film on the surface of a light-emitting element in the arrangement shown in FIG. 15;

FIGS. 17A and 17B are sectional views of the photocoupler according to the fifth embodiment of the present invention, in which FIG. 17B is a sectional view of a wafer on which a plurality of couplers are formed, and FIG. 17A is an enlarged sectional view of one of these devices;

FIG. 21 is a graph showing the relationship between the anodic oxidation time and the light emission (PD current) in the present invention;

FIG. 22 is a graph showing the relationship between the anodization time and the maximum light emission efficiency in the present invention;

FIG. 23 is a graph showing the relationship between the anodic etching current density and the maximum light emission efficiency in the present invention;

FIG. 24 is a graph showing the relationship between the anodic oxidation injection current, the maximum light emission, and the maximum light emission efficiency in the present invention;

FIG. 25 is a graph showing the relationship between the anode voltage rising speed and the maximum light emission efficiency in the present invention;

FIGS. 28A and 28B are views for explaining locations where luminescent centers are present, in which FIG. 28A is an enlarged sectional view of a silicon micro-skeleton, and FIG. 28B is a further enlarged sectional view of a circle 28B in FIG. 28A;

FIG. 30 is a sectional view of the semiconductor device according to the ninth embodiment of the present invention;

FIG. 31 is a sectional view of the semiconductor device according to the 11th embodiment of the present invention;

FIG. 33 is a sectional view of the semiconductor device according to the 13th embodiment of the present invention;

FIGS. 34A to 34D are sectional views showing the fabrication steps of the semiconductor device according to the 14th embodiment of the present invention following the order of the steps;

FIG. 40 is a graph showing the diode characteristic of the semiconductor device of the 17th embodiment;

FIG. 41 is a sectional view of the semiconductor device according to the 21st embodiment of the present invention;

DETAILED DESCRIPTION OF THE PREFERRED EMBODIMENTS

Figure 6:
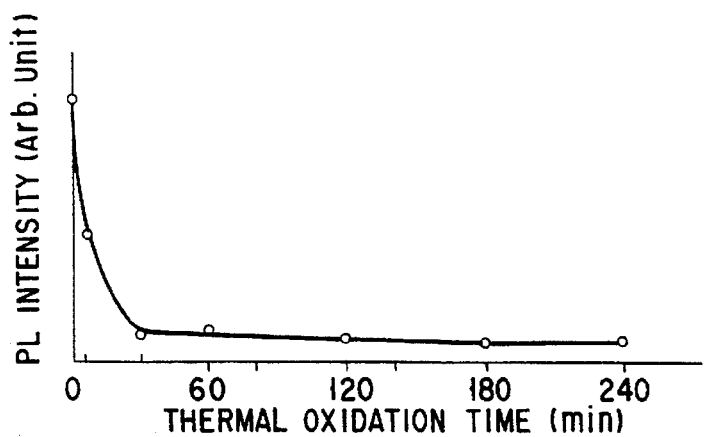
FIG. 6 is a graph showing the relationship between the thermal oxidation and the PL intensity of a conventional photo-device.

Prior to the description of the preferred embodiments, the relationship between the impurity concentration of a silicon substrate on which porous silicon is formed, the mechanical strength of a porous silicon semiconductor device, and the optical characteristics of the device will be described below.

The present inventors have made extensive studies and found that porous silicon formed from a silicon substrate whose impurity concentration is $1 \times 10^{19}$ cm$^{-3}$ or less is difficult to apply to a light-emitting device by conventional methods, since the luminescence of the porous silicon is deteriorated upon irradiation with ultraviolet radiation and the mechanical strength of the porous silicon is also low because of the micro-skeleton thereof having silicon wires of relatively small diameter. The present inventors have also found that porous silicon formed with an impurity concentration of $1 \times 10^{19}$ to $1 \times 10^{21}$ cm$^{-3}$ has the micro-skeleton having silicon wires of relatively large diameter, luminesces when thermally oxidized, has an increased strength and extremely stable optical characteristics, and is greatly improved in the mechanical strength owing to the thick oxidation layer.

That is, porous silicon formed with an impurity concentration of $1 \times 10^{19}$ cm$^{-3}$ or less has a fine sponge structure, so the size of fine particles is relatively small. It is assumed that this lowers the structural strength. It is also assumed that natural oxidation proceeds upon ultraviolet irradiation, and this decreases the number of fine particles of optimum size which emit visible light, resulting in a decrease in the light emission intensity. On the other hand, porous silicon formed from a silicon substrate with an impurity concentration of $1 \times 10^{19}$ cm$^{-3}$ or more has a relatively large silicon fine particle size. It is considered that this improves the mechanical strength of the porous silicon. It is also considered that the size of the silicon fine crystal in the porous silicon is further increased by annealing.

In this state, however, the silicon fine crystal has not reached the quantum size by which luminescence is possible. It is therefore necessary to further decrease the size of the fine particles by, e.g., oxidation. If, for example, anodic oxidation is performed for porous silicon in a hydrochloric acid solution, the oxide film formed on the surface of the porous silicon lacks stability. Consequently, the light emission intensity decreases upon irradiation with light (ultraviolet radiation). On the other hand, oxide films formed by thermal oxidation are stabler than films formed by anodic oxidation or natural oxidation, since deterioration in the luminescence is small.

As discussed above, porous silicon formed with an impurity concentration of $1\times10^{19}$ cm$^{-3}$ or less does not luminesce any longer when thermally oxidized for a long period of time (30 min. or longer, or 0.01 μm or larger as the thickness of the oxide film). This makes it difficult to use the oxide film as a passivation film. It turns out that the impurity concentration is preferably $1\times10^{19}$ cm$^{-3}$ or more, and more preferably $1\times10^{20}$ to $1\times10^{21}$ cm$^{-3}$ by which the most intense visible luminescence is obtained and the mechanical strength is high.

Examples of the dopant are phosphorus, antimony, and arsenic, as an n-type dopant, and boron, as a p-type dopant. Boron having a large segregation constant (0.8) is evenly distributed in the crystal. However, the three n-type dopants enumerated above readily form nonuniform distributions because their segregation constants are small. An appropriate n-type dopant is phosphorus whose segregation constant is relatively large (0.35).

The thickness of the oxide film is determined in accordance with the structure (quantum size) of the porous silicon anodically oxidized. The fine crystal size of porous silicon formed with an impurity concentration of $1\times10^{19}$ to $1\times10^{21}$ cm$^{-3}$ is relatively large and hence cannot be directly used as the quantum size by which luminescence is possible. Therefore, it is necessary to make the structure finer by means of, e.g., oxidation.

It is found that the oxide film thickness of the porous silicon formed with the impurity concentration discussed above is necessarily 0.01 μm or more to obtain visible light emission, and preferably 0.02 μm or more (which is formed by thermal oxidation at 900° C. for 30 min. or longer) to obtain visible light emission and stabilize the emission. It is also found that if the oxide film thickness is larger than needed, the silicon fine crystal vanishes by the oxidation, resulting in a decrease in the light emission intensity. Furthermore, in the case of an EL device a thick oxide film makes current injection difficult. For these reasons, the oxide film thickness is preferably 10 μm or less, and more preferably 1.0 μm or less in terms of the light emission intensity and the current injection. That is, the thickness of the thermal oxide film is preferably 0.01 to 10 μm, and more preferably 0.02 to 1.0 μm.

The first aspect of the present invention based on the above findings, therefore, can provide a practical porous silicon photo-device (e.g., a light-emitting device) having a high mechanical strength and capable of emitting intense visible light.

It is also found that a porous silicon layer on the surface of which a thermal oxide film is formed as discussed above emits intense visible light. On the other hand, a thermally oxidized porous silicon layer absorbs almost no light in a wavelength region (long-wavelength region) whose wavelength is longer than that of visible light. Consequently, light in this long-wavelength region is easily transmitted through the thermally oxidized porous silicon layer. However, when irradiated with blue light or light in the ultraviolet region (short-wavelength region), the thermally oxidized porous silicon layer emits light in the visible and near-infrared regions of 0.6 μm or higher. That is, the thermally oxidized porous silicon layer has a wavelength converting function.

According to the second aspect of the present invention, light enters a photoelectric conversion element through a thermally oxidized porous silicon layer with the wavelength converting function. Consequently, light in the short-wavelength region which cannot be photoelectrically converted by conventional devices is converted into light in the visible and near-infrared regions by the wavelength converting function of the thermally oxidized porous silicon layer. That is, the light is converted into one capable of being photoelectrically converted even by conventional photoelectric conversion elements. This widens the effective sensitivity region of the photoelectric conversion element. Therefore, the second aspect of the present invention can provide a porous silicon photo-device which is usable in a wavelength region wider than those of conventional devices.

The embodiments of the present invention will be described below with reference to the accompanying drawings. The first to third embodiments relate to the first aspect of the present invention. The fourth to seventh embodiments relate to the second aspect.

(First Embodiment)

FIG. 1 is a sectional view of the porous silicon photo-device (light-emitting device) according to the first embodiment of the present invention. In FIG. 1, reference numeral 1 denotes a heavily doped $P^{++}$-type silicon substrate whose p-type impurity concentration is $10^{19}$ cm$^{-3}$ or more. A $P^{++}$-type thermally oxidized porous silicon layer (PS layer) 2 is selectively formed on the surface of the substrate 1. The p-type impurity concentration of the layer 2 is $10^{19}$ cm$^{-3}$ or more. The porous silicon layer 2 comprises a large number of pores including silicon wires (not shown) to be described later, thus having expanded surfaces. A thermally oxidized silicon film (not shown) with a thickness of 0.02 μm or larger is formed on the surfaces (side surfaces) of the silicon wires. The $P^{++}$-type thermally oxidized porous silicon layer 2 is preferably formed by making the surface of the $P^{++}$-type silicon substrate 1 porous and thermally oxidizing the surface for a long time period (30 min. or longer) at a high temperature (900° C. or higher).

An $n^{++}$-type thermally oxidized porous silicon layer (PS layer) 3 is formed on the layer 2. The n-type impurity concentration of this layer 3 is $10^{19}$ cm$^{-3}$ or more. The porous silicon layer 3 comprises a number of pores including $n^{++}$-type silicon wires (not shown) formed in a one-to-one correspondence with the $P^{++}$-type silicon wires of the porous silicon layer 2, thus having expanded surfaces. A thermally oxidized silicon film (not shown) with a thickness of 0.02 μm or more is formed on the surfaces of these silicon wires. P-n junctions are formed by the silicon wires of the $n^{++}$-type thermally oxidized porous silicon layer 2 and the silicon wires of the $P^{++}$-type thermally oxidized porous silicon layer 2. The $n^{++}$-type thermally oxidized porous silicon layer 3 is formed by, e.g., doping an n-type impurity into the surface of the $P^{++}$-type thermally oxidized porous silicon layer 2. A transparent electrode 4 is formed on the porous silicon layer 3. This transparent electrode 4 is formed by using, e.g., an ITO transparent conductive film.

FIG. 2A is an enlarged sectional view of the surface of the $P^{++}$-type thermally oxidized porous silicon layer 2 when thermal oxidation of the surface is completed. In FIG. 2A, reference numeral 2a denotes $P^{++}$-type porous silicon layers (silicon wires) not oxidized; and 2b, a thermally oxidized silicon film, i.e., an amorphous $SiO_2$ film. As discussed above, the thickness of this amorphous $SiO_2$ film is 0.02 μm or more. In this manner, the thermally oxidized silicon 2b is formed on all the surfaces of the silicon wires 2a. In other words, the "surface" of the porous layer means the entire surface including the deep portions of the micro-structure. The dotted line A—A indicates a surface region which is removed by dry etching or the like treatment. When this region is removed, the $P^{++}$-type porous silicon layers (silicon wires) 2a that are not oxidized are exposed to the surface.

FIG. 2B shows the state in which the $n^{++}$-type silicon wires (porous silicon layers) 3 are formed on $P^{++}$-type silicon wire layers 2a' by doping an n-type impurity from the state shown in FIG. 2A. As a result, a p-n junction is formed in each silicon wire. The transparent electrode 4 is formed on top of the surface of the substrate thus formed.

A method of fabricating the porous silicon photo-device of this embodiment will be described below following the order of the fabrication steps. In this method, a silicon substrate whose specific resistance is 0.004 to 0.006 $\Omega$.cm, p-type impurity is B (boron), and major surface is a (100) surface is used as the $P^{++}$-type silicon substrate 1.

First, the $P^{++}$-type silicon substrate 1 is anodized in a hydrofluoric acid solution (25% hydrofluoric acid +50% ethanol) by using platinum as a counter electrode. Consequently, a $P^{++}$-type porous silicon layer about 16 µm thick which is to serve as the $P^{++}$-type thermally oxidized porous silicon layer 2 is formed on the substrate 1. This porous silicon layer comprises a large number of pores which produce expanded surfaces. This anodization is done in the dark with a current density of 10 mA/cm$^2$ for 40 min. The result is that a number of $P^{++}$-type semiconductor wires are formed nearly parallel to each other. In this case it is also effective to perform anodization after the surface of the substrate 1 is roughened, as will be described later in the 17th embodiment.

Subsequently, a $P^{++}$-type thermally oxidized porous silicon layer 2 is formed by thermally oxidizing the $P^{++}$-type porous silicon layer in an oxidation oven. As an example, this thermal oxidation is performed by leaving the substrate 1 to stand for 210 min. in a chamber containing a high-concentration oxygen atmosphere, in which the oxygen gas flow rate is 600 ml/min. and the nitrogen gas flow rate is 1000 ml/min.

To ensure the contact between an $n^{++}$-type thermally oxidized porous silicon layer 3 and a transparent electrode 4 to be formed in the subsequent steps, the surface of the thermally oxidized porous silicon film 2 is removed by an amount of about 4 µm by dry etching. When reverse etching is used as this dry etching, for example, the etching is done with an energy density of 0.105 W/cm$^2$ for 6 hours to remove a portion of the thermally oxidized porous silicon film 2 from the surface to a depth of about 4 µm together with the thermally oxidized silicon film formed on the surface of the film 2. Consequently, the upper portions of the $P^{++}$-type silicon wires are exposed.

Subsequently, phosphorus is doped into the surface of the $P^{++}$-type thermally oxidized porous silicon layer 2 in order to form p-n junctions. More specifically, OCD (tradename: manufactured by TOKYO OHKA KOGYO CO., LTD.) as a liquid, coating type phosphorus diffusing agent is spin-coated on the surface of the sample at 3000 rpm for 30 sec. In this manner the OCD is coated once. The phosphorus is thermally diffused by annealing at a temperature of 850° C. and atmosphere gas flow rates of $N_2$: $O_2$=11 ml/min.: 50 ml/min. for 40 minutes. As a consequence, the phosphorus concentration in a region from the surface to a depth to about 3 µm of the $P^{++}$-type thermally oxidized porous silicon layer 2 becomes approximately 1×10$^{20}$ cm$^{-3}$; that is, an $n^{++}$-type thermally oxidized porous silicon layer 3 about 3 µm in thickness is formed.

Lastly, an ITO film about 300 µm thick serving as a transparent electrode is vapor-deposited on the entire surface by sputtering. This ITO film is patterned on the porous silicon by masking the sputtered film, and in this way a transparent electrode 4 is formed. In this manner, the porous silicon photo-device is completed. The sputtering conditions are, for example, such that the atmosphere gas flow rates are Ar: $O_2$=20 sccm: 1 sccm, the RF voltage is 1.3 kV, the current is 120 mA, the power is 100 W, and the chamber internal pressure is 15 µtorr.

The characteristics of the porous silicon photo-device of this embodiment fabricated as discussed above were evaluated by applying a positive voltage to the ITO electrode 4. The result was that the porous silicon photo-device of this embodiment exhibited strong rectification properties. Also, the porous silicon photo-device started to emit visible light with a peak intensity at about 700 nm when the voltage exceeded about 3 V. This light emission intensity was found to increase with increasing current.

In addition, the structural strength of the porous silicon constituting the p-n junctions of the porous silicon photo-device of this embodiment was checked, with the result that the structural strength was higher than those of conventional devices. The present inventors consider that this is so because the silicon fine crystal of the order of nanometers in the $P^{++}$-type porous silicon film 2, FIG. 2A, gains, by the thermal oxidation, a size by which visible luminescence is possible, and the silicon fine particles of the order of micrometers is recrystallized by the annealing, leading to the improvement in the structural strength of the porous silicon layer constituting the p-n junctions.

Furthermore, the fabrication method of this embodiment makes it possible to form porous semiconductors superior in controllability and reproducibility to those obtained by conventional fabrication methods performed by wet etching using hydrofluoric acid or fluoronitric acid. This realizes stable luminescence characteristics. According to the first embodiment as discussed above, it is possible to obtain a practical porous silicon photo-device (e.g., a light-emitting element) which has a high mechanical strength and can emit intense visible light.

(Second Embodiment)

FIG. 3 is a sectional view of the porous silicon photo-device (light-emitting device) according to the second embodiment of the present invention. This embodiment differs from the first embodiment in that an $n^+$-type silicon substrate is used as the base substrate. The arrangement is similar to that shown in FIG. 1 except that the conductivity types, p-type and n-type, are interchanged. Therefore, the fabrication steps will be described by omitting a detailed description of the arrangement.

First, a phosphorus-doped $n^+$-type silicon substrate 11 having a specific resistance of 0.0005 to 0.0009 $\Omega$.cm and a (100) surface is prepared. This $n^+$-type silicon substrate 11 is anodized in a hydro-fluoric acid solution (25% hydrofluoric acid +50% ethanol) by using platinum as a counter electrode. Consequently, an $n^{++}$-type porous silicon layer about 16 µm thick which is to serve as an $n^{++}$-type thermally oxidized porous silicon layer 12 is formed on the $n^+$-type silicon substrate 11. This anodization is done in the dark with a current density of 10 mA/cm$^2$ for 40 min.

Subsequently, the $P^{++}$-type porous silicon layer is converted into a $P^{++}$-type thermally oxidized porous silicon layer 12 by thermal oxidation using an oxidation oven. A thermally oxidized silicon film with a thickness of 0.02 µm or more is formed on the surface of this thermally oxidized porous silicon layer 12. As an example, the thermal oxidation is performed in a chamber containing a high-concentration oxygen atmosphere, in which the gas flow rates are $O_2$: $N_2$=600 ml/min.: 1000 ml/min., for 60 min.

To ensure a good electrical contact, the thermally oxidized porous silicon layer on the outermost surface of the sample is removed by an amount of about 4 µm by reverse sputtering. This reverse sputtering is done with an energy density of 0.105 W/cm² for 6 hours to remove a portion of the thermally oxidized porous silicon layer from the surface to a depth of about 4 µm.

Subsequently, boron is doped on the surface of the $n^{++}$-type thermally oxidized porous silicon layer 12 in order to form a p-n junction. More specifically, PBF (tradename: manufactured by TOKYO OHKA KOGYO CO., LTD.) as a liquid, coating type phosphorus diffusing agent is spin-coated on the surface of the sample at 7000 rpm for 30 sec. In this manner the PBF is coated once. The boron is thermally diffused by annealing at a temperature of 900° C. and gas flow rates of $N_2$:$O_2$=11 ml/min.: 50 ml/min. for one hour. As a consequence, the boron concentration in a region from the surface to a depth to about 3 µm of the $n^{++}$-type thermally oxidized porous silicon layer 12 becomes approximately $1\times10^{20}$ cm$^{-3}$; that is, a $P^{++}$-type thermally oxidized porous silicon layer 13 about 3 µm in thickness is formed.

Lastly, an ITO film about 300 µm thick serving as a transparent electrode is vapor-deposited on the entire surface by sputtering, thereby forming a transparent electrode 14. In this way the photo-device is completed. The sputtering conditions are such that, for example, the gas flow rates are Ar: $O_2$=20 sccm: 1 sccm, the RF voltage is 1.3 kV, the current is 120 mA, the power is 100 W, and the chamber internal pressure is 15 µtorr.

The characteristics of the porous silicon photo-device of this embodiment fabricated as discussed above were evaluated by applying a positive voltage to the ITO electrode 14. The result was that the porous silicon photo-device of this embodiment exhibited strong rectification properties. Also, the porous silicon photo-device started to emit visible light with a peak intensity at about 700 nm when the voltage exceeded about 3.5 V. This light emission intensity was found to increase with increasing current.

(Third Embodiment)

FIG. 4 is a sectional view of the porous silicon photo-device (light-emitting device) according to the third embodiment of the present invention. The porous silicon photo-device of this embodiment comprises a $P^{++}$-type silicon substrate 21, a $P^{++}$-type thermally oxidized porous silicon layer 22 selectively formed on the surface of the $P^{++}$-type silicon substrate 21, and a transparent electrode 23 formed on the porous silicon layer 22.

That is, the porous silicon photo-device of this embodiment is simplified by omitting the $n^{++}$-type thermally oxidized porous silicon layer from the arrangement of the first embodiment. The porous silicon photo-device with this arrangement also has a higher mechanical strength than those of conventional devices and capable of emitting intense visible light and providing stable luminescence characteristics.

FIG. 5 is a graph showing the relationship between the thermal oxidation time and the PL intensity of a porous silicon photo-device in which a thermally oxidized porous silicon layer was formed by using a silicon substrate with a high impurity concentration ($1\times10^{19}$ cm$^{-3}$) by which the specific resistance was about 0.004 to 0.006 Ωcm.

Almost no PL was obtained when the thermal oxidation time was zero. That is, the PL intensity was substantially zero when no thermal oxidation was performed. Also, the PL remained nearly unchanged when rapid thermal oxidation was done for a short time period of 5 min. However, when thermal oxidation was performed for a long time period of 60 min., luminescence having a peak at approximately 700 nm was observed. No change was found in the peak wavelength by thermal oxidation of longer periods of time. As can be seen from FIG. 5, the PL intensity varied almost linearly with increasing thermal oxidation time and became about 36 times the initial intensity when the oxidation time was 480 min.

For comparison, FIG. 6 shows the relationship between the thermal oxidation time and the PL intensity of a porous silicon photo-device in which a thermally oxidized porous silicon layer was formed by using a silicon substrate with a low impurity concentration ($1\times10^{15}$ cm$^{-3}$). An Ar laser (488 nm) was used as an excitation light source.

Before thermal oxidation, a spectrum having a peak intensity at about 670 nm was obtained. The PL intensity was decreased by thermal oxidation in a high-concentration oxygen atmosphere with gas flow rates of $O_2$: $N_2$=600 ml/min.: 1000 ml/min. The PL intensity was decreased to about ½ by thermal oxidation of 5 min. When thermal oxidation was done for 30 min. or longer, the main peak completely disappeared and a new weak luminescence appeared on the short-wavelength side. No change was found in the PL spectrum after thermal oxidation of 30 min. or longer.

The relationship between decay of the PL intensity and the impurity concentration was checked with the results shown in FIG. 7 which illustrates the PL intensity as a function of the laser irradiation time. Almost no decay of the PL intensity was found in the sample obtained by thermally oxidizing $P^{++}$-type porous silicon with a high impurity concentration ($1\times10^{19}$ cm$^{-3}$) for 210 min.

As a comparative example, a sample was obtained by rapidly, thermally oxidizing $p^-$-type porous silicon with a low impurity concentration ($1\times10^{15}$ cm$^{-3}$) for 5 min. Consequently, the PL intensity decayed approximately 40% by laser irradiation (Ar laser, power density 1.8 W/cm²) of 8 min.

The above results indicate that neither a sufficient light emission intensity nor stable luminescence characteristics can be attained by thermal oxidation of $p^-$-type porous silicon with a low impurity concentration. However, when $P^{++}$-type porous silicon with a high impurity concentration ($1\times10^{19}$ cm$^{-3}$ or higher) is thermally oxidized for long periods of time, as in this embodiment, a sufficient light emission intensity is obtained. Also, no fatigue of luminescence is found, so it is possible to obtain stable luminescence characteristics.

FIG. 8 is a graph showing the relationship between the hardness of $p^-$-type porous silicon with a low impurity concentration ($1\times10^{15}$ cm$^{-3}$) and the thermal oxidation time. More specifically, FIG. 8 is a graph which plots the Vickers hardness when the indentor penetration depth from the surface of porous silicon was 0.3 µm as a function of the thermal oxidation time. Note that the hardness was measured with a microhardness meter.

Before thermal oxidation, the hardness of the $p^-$-type porous silicon was about 39. After thermal oxidation of 5 min. the hardness increased to 279, about a sevenfold value. The hardness was 329 when thermal oxidation was done for 60 min. When thermal oxidation was performed for longer periods of time, the hardness decreased. That is, even in the case of $p^-$-type porous silicon with a low impurity concentration, it is possible to improve the mechanical strength by performing thermal oxidation for a proper period of time.

FIG. 9 is a graph which plots the hardness of $p^{++}$-type porous silicon with a high impurity concentration ($1\times10^{19}$ $cm^{-3}$ or higher) as a function of the thermal oxidation time. Details of the measurements are identical with those of FIG. 8.

The hardness of the $P^{++}$-type porous silicon was 533 before thermal oxidation and increased to 941, about 1.8 times the initial value, when thermal oxidation was performed for 5 min. When thermal oxidation was done for 210 min., the hardness increased to approximately 1111 (42 GPa), about 1.5 times that of silicon. That is, in the case of $P^{++}$-type porous silicon with a high impurity concentration, as in the previous case, it is possible to improve the mechanical strength by performing thermal oxidation for an appropriate period of time. In addition, the minimum value of the hardness of $P^{++}$-type porous silicon is still higher than the maximum value of the hardness of $p^-$-type porous silicon with a low impurity concentration.

(Fourth Embodiment)

FIGS. 10A and 10B are sectional views showing the photo-device (photocoupler) according to the fourth embodiment of the present invention. FIG. 10B is a sectional view illustrating a portion of a wafer on which the photo-devices are repeatedly formed. FIG. 10A is an enlarged sectional views illustrating one of these devices.

The photocoupler of this embodiment generally comprises a porous silicon light-emitting element, a pin photodiode, and a thermally oxidized porous silicon layer 42 formed between the porous silicon light-emitting element and the pin photodiode.

The porous silicon light-emitting element primarily consists of an n-type porous silicon layer 47, a p-type polycrystalline silicon layer 45, input electrodes 48 and 49, and an ITO electrode 44. Although conventional porous silicon layers can be used as the p-type porous silicon layer 47, it is desirable to use a high-impurity-concentration porous silicon layer and a thermal oxide film similar to those used in the third embodiment of the present invention. In addition to these layers, a filled charge injection layer to be described later in the eighth embodiment also can be used. The major components of the pin photodiode are an i-type silicon substrate 41, a $p^+$-type impurity diffused layer 43, and an $n^+$-type impurity diffused layer 53.

Since the thermally oxidized porous silicon layer 42 is provided as an electrical isolation layer between the light-emitting and the light-receiving elements, the matrixes of the micro-structure thereof must be fully oxidized by thermal oxidation. Therefore, it is preferable to use a silicon substrate of medium- or low-impurity-concentration and be fully oxidized until the layer 42 becomes insulative.

Light emitted from the porous silicon light-emitting element is incident on the light-receiving surface of the pin photodiode. In other words, in the photocoupler of this embodiment the thermally oxidized porous silicon layer is formed in contact with the light-receiving surface of the pin photodiode.

This thermally oxidized porous silicon layer absorbs almost no light in a wavelength region (long-wavelength region) whose wavelength is longer than that of visible light. Light in this long-wavelength region is easily transmitted through the thermally oxidized porous silicon layer. That is, the thermally oxidized porous silicon layer has a low absorbance and a high transmittance with respect to light in the long-wavelength region.

When blue light or light in the ultraviolet region (short-wavelength region) enters the thermally oxidized porous silicon layer, the layer produces PL in regions of 0.6 μm or higher from the visible region to the near-infrared region. In the photocoupler of this embodiment, therefore, if the luminescence of the porous silicon light-emitting element is in the long-wavelength region, i.e., if the luminescence is in the sensitivity region of the pin photodiode, the luminescence is directly input to the pin photodiode as in conventional photocouplers.

On the other hand, if the luminescence of the porous silicon light-emitting element is in the short-wavelength region, i.e., if the luminescence is outside of the sensitivity region of the pin photodiode, the luminescence is converted into luminescence in regions from the visible region to the near-infrared region by the thermally oxidized porous silicon layer and then input to the pin photodiode. This allows the pin photodiode to effectively, photoelectrically convert the light outside its sensitivity region.

As discussed above, in the photocoupler of this embodiment which includes the thermally oxidized porous silicon layer 42, the wavelength converting function of the layer 42 widens the effective sensitivity region of the pin photodiode as a silicon photoelectric conversion element. This drastically broadens the usable wavelength region compared to those of conventional photocouplers.

Additionally, the thermally oxidized porous silicon layer 42 can be made thick. Consequently, in this embodiment the dielectric withstand voltage between the light-emitting and light-receiving elements is increased and the capacitive coupling between them is decreased, in comparison with devices in which thin-film insulating layers formed by conventional thin film formation techniques are employed.

Details of the photocoupler of this embodiment will be described below according to the order of the fabrication steps illustrated in FIGS. 11A to 11E.

Figure 11A:
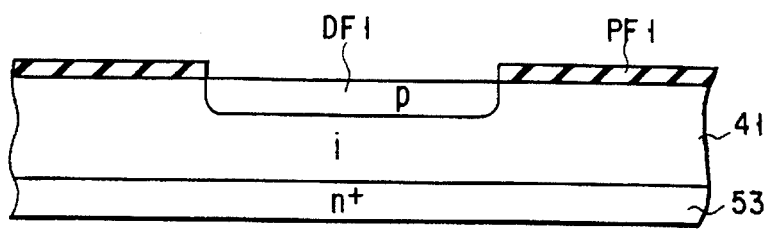
FIGS. 11A to 11E are sectional views showing the fabrication steps of the photocoupler of the fourth embodiment following the order of the steps.

First, an $n^+$-type impurity diffused layer 53 is formed on the lower surface of an i-type silicon substrate 41. A passivation film PF1 which is formed by stacking an SiN film on an $SiO_2$ film is formed on the upper surface of the substrate 41, and holes are selectively formed in the film PF1 to form a plurality of p-type impurity diffused layers DF1 (only one is shown) which are to serve as a plurality of thermally oxidized porous silicon layers 42 (only one is shown) (FIG. 11A).

Figure 11B:
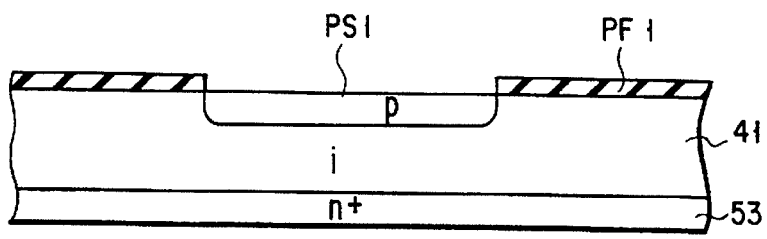

Subsequently, the p-type impurity diffused layer DF1 is made porous to form p-type porous silicon layers 42 later (FIG. 11B). More specifically, the p-type impurity diffused layer can be made porous by dipping the substrate 41 into a hydrofluoric acid solution and irradiating the substrate with light. Consequently, a porous silicon layer PS1 is formed in self-alignment.

Although the p-type impurity diffused layers are formed in this embodiment, it is also possible to directly form porous silicon layers without forming p-type impurity diffused layers. One example of the method of directly forming porous silicon layers is to cover a region except for those serving as the porous silicon layers with a mask having a hydrofluoric acid resistance, such as a silicon nitride film, and perform anodization in this state. Note that it is also possible to form porous silicon layers by performing anodization using a mask after p-type impurity diffused layers are formed.

Although the thickness of the porous silicon layer PS1 need only be about 10 μm, it can also be increased or decreased where necessary. If the thickness is increased, the dielectric withstand voltage between the input and the output in the fabrication of the photocoupler can be increased. If the thickness is decreased, the optical coupling efficiency can be increased.

Note that if the thickness is increased, the stress remains more strongly in the oxidized porous silicon layers after thermal oxidation of the porous silicon layers PS1. However, the stress acting on the entire substrate is decreased by forming a plurality of tiny porous silicon layers on the substrate as in this embodiment, i.e., by selectively forming a plurality of pin photodiodes on the surface of the substrate, rather than by forming a single, large porous silicon layer on the entire surface of the substrate. This makes it possible to prevent inconvenience such as warpage of the overall substrate.

Also, in this arrangement, as depicted in the sectional view of FIG. 10A, the light-receiving surface with a semi-circular shape of the pin photodiode surrounds the porous silicon light-emitting element. This effectively improves the light coupling efficiency.

Figure 11C:
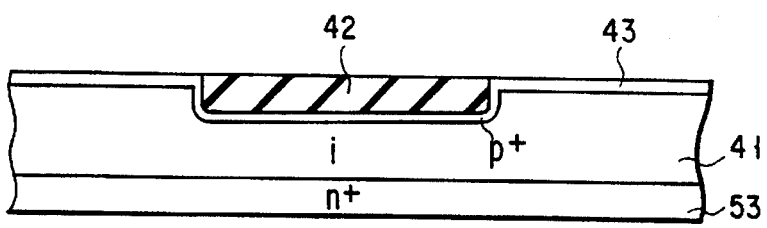

Subsequently, after the passivation film PF1 is removed from the upper surface of the substrate 1, a p-type impurity is diffused into the surface to form a $p^+$-type impurity diffused layer 43. The porous silicon layer PS1 is thermally oxidized to form a thermally oxidized porous silicon layer 42 (FIG. 11C). This thermal oxidation process is accomplished by, e.g., coating a liquid diffusing agent on the entire substrate surface and, after the diffusing agent penetrates into the porous silicon layer, thermally oxidizing the substrate by heating.

More specifically, the thermal oxidation is performed by baking the substrate in the atmospheric air at 120° C. for 15 min., sintering the substrate in the atmospheric air at 450° C. for 20 min., and thermally oxidizing the substrate at 800° to 1200° C. for 5 min. or more, desirably at 1100° C. for 20 min. The atmosphere in this case is first an atmosphere containing about 5% of oxygen in nitrogen. After the impurity is predeposited into the bulk silicon substrate, the atmosphere is altered to a normal oxidizing atmosphere of 100% oxygen to which water vapor can be further added. With this method, the diffusion also proceeds from the interface between the thermally oxidized porous silicon layer and the bulk silicon substrate. Consequently, a p-i-n junction can be formed in self-alignment along the interface of the thermally oxidized porous silicon film 42.

Although a liquid material is used as the diffusion source in this embodiment, it is also possible to use a gas diffusion source or a solid diffusion source. By this diffusion step, the thickness of the i-type silicon substrate 41 below the thermally oxidized porous silicon layer 42, i.e., the thickness of the i-type layer of the pin photodiode is determined in order that the reception sensitivity characteristics of the pin diode cover the PL wavelength of the thermally oxidized porous silicon layer 42. More specifically, the thickness of the i-type layer is set to 10 µm or larger so that light with a wavelength of 0.63 µm is captured with a quantum efficiency of nearly 100%.

This embodiment concerns a photocoupler. However, a pin photodiode as a photoelectric conversion device is completed if, in this stage, an output electrode is formed on the $p^+$-type diffused layer 43. Therefore, this embodiment is also directed to the formation of a photoelectric conversion device.

Figure 11D:
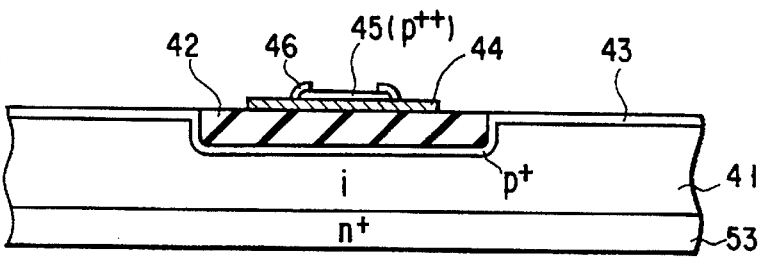

The process then proceeds to the fabrication of a light-emitting element. First, an ITO electrode 44 is formed on the thermally oxidized porous silicon layer 42. A $P^{++}$-type polycrystalline silicon layer 45 (impurity concentration $1 \times 10^{19}$ cm$^{-3}$ or higher) is grown on the ITO electrode 44. It is readily possible to form polycrystalline containing a p-type impurity by adding boron during the growth. A silicon nitride film to serve as a passivation layer 46 is formed and patterned, thereby forming a passivation layer 46 (FIG. 11D).

Figure 11E:
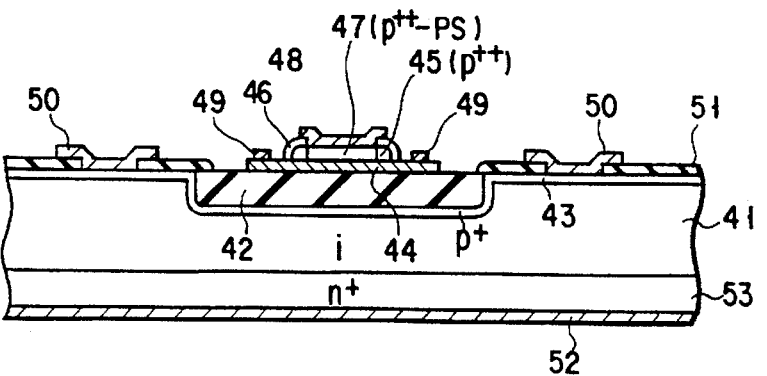

As in the third embodiment, anodization is performed by using this passivation layer 46 as a mask to selectively make a portion of the $P^{++}$-type polycrystalline silicon 45 porous, forming a thick oxide film. Thereafter, the surface is etched to expose the top surface of the $P^{++}$-type silicon wire, thereby forming a $P^{++}$-type porous silicon layer 47. Lastly, a passivation layer 51 is formed, and input electrodes 48 and 49 and an output electrode 50 are formed. In this way the photocoupler is completed (FIG. 11E).

Alternatively, as illustrated in FIG. 12, a surface reflecting layer 86 can also be formed on the back side of the light-emitting element and on the surface (the substrate surface opposing the light-receiving element) of the insulating isolation layer made from thermally oxidized porous silicon, after the formation of a light-emitting element by making the polycrystalline silicon layer 84 stacked on ITO film 83 porous. This surface reflecting layer 86 reflects light emitted by the light-emitting element or wavelength-converted light from the light-receiving element, thereby reducing leakage light to the outside. More specifically, a layer whose reflectance is lower than those of these layers or a layer which is not transparent to these light components is stacked. Consequently, the light utilization efficiency is improved, and this further increases the coupling efficiency. Note that in FIG. 12, reference numeral 84 denotes a polycrystalline silicon layer; 85, a thermally oxidized porous silicon layer; 87, a luminescent porous silicon layer; 88, output electrodes; and 89, input electrodes.

In the photocoupler completed as discussed above, all of the light-receiving and light-emitting elements as the constituent elements are formed integrally, and the electrodes except for an output electrode 52 (FIG. 10A) are formed on the major surface (upper surface) of the substrate. This eliminates the use of a complicated, cumbersome coupling step such as is used in conventional methods.

The characteristics of the photocoupler thus obtained were checked, and it was found that the dielectric withstand voltage was as high as 2000 V or more and the optical coupling efficiency also was high. It is estimated that these good results were obtained for the reasons explained below.

The dielectric withstand voltage is improved since the thermally oxidized porous silicon layer 42 obtained by thermal oxidation of the porous silicon layer can be formed to have a thickness larger than those of silicon oxide films obtained by conventional thin film formation techniques.

The optical coupling efficiency is improved because the light-receiving and light-emitting elements are in direct contact with the thermally oxidized porous silicon layer 42 without using any adhesive layer, particularly the interface between the $p^+$-type impurity diffused layer 43 and the thermally oxidized porous silicon layer 42 has a matching on the order of atoms, so the light loss in that portion is sufficiently small. Another reason is that all the light components are effectively used since a p-i-n junction is formed along the interface, i.e., since the light-receiving surface with a semi-circular shape of the pin photodiode surrounds the porous silicon light-emitting element. Still another reason is that light with a short wavelength outside the sensitivity region of the pin photodiode can also be used due to the wavelength converting effect of the thermally oxidized porous silicon layer 42.

As shown in FIG. 13, an optical integrated circuit including a light-emitting/light-receiving element region consisting of the combination of light-receiving and light-emitting elements and a signal processing circuit region 96 can be formed on the same surface of a single chip. Note that in FIG. 13, reference numeral 91 denotes a light-emitting element region; 92, a light-emitting element electrode; 93, an insulating isolation region; 94, a light-receiving element region; and 95, an interconnection for connecting the light-receiving element region 94 to the signal processing circuit region 96.

It is particularly desirable, as illustrated in FIG. 14, to form a plurality of light-receiving/light-emitting element regions in the peripheral portion of a chip 90 so as not to overlap each other when viewed from the edges of the chip. This eliminates intersections of bonding wires (leads) 97 from the light-emitting portions to external devices, facilitating wiring and mounting on external devices.

In addition, in actually mounting the chip, the formation of a black resin 98, FIG. 15, is effective to suppress external light or mutual leakage light, since the structure has the light-emitting and the light-receiving portions integrally. To further increase the light utilization efficiency of the light-emitting portion, as illustrated in FIG. 16, a white, high-reflectance resin 99 is formed on each of the light-receiving/ light-emitting element regions and molded with a black resin 98, thereby isolating the individual photocouplers. In FIGS. 15 and 16, the same reference numerals denote the same parts.

In the above embodiment, silicon-based light-emitting elements are formed. However, light-emitting elements can also be formed by growing a compound semiconductor, such as a gallium-arsenic-phosphorus semiconductor or a gallium-phosphorus semiconductor, or by bonding a chip, on which elements are already formed, directly to a substrate.

(Fifth Embodiment)

Figure 17A:
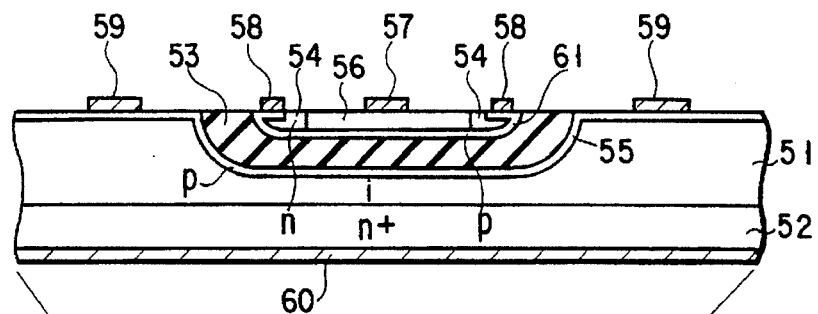
Figure 17B:
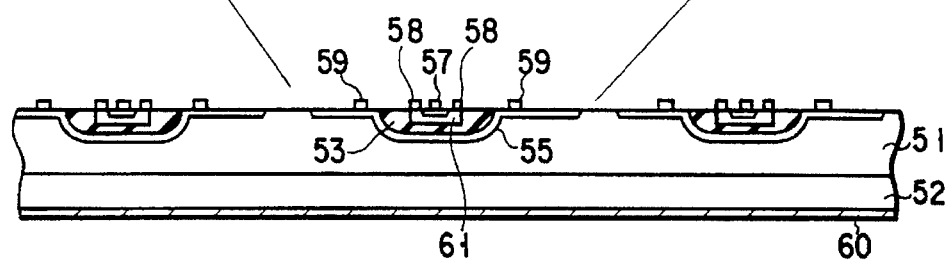

FIGS. 17A and 17B are sectional views of the photo-device (photocoupler) according to the fifth embodiment of the present invention. FIG. 17B is a sectional view showing a portion of a wafer on which the photocouplers are successively formed. FIG. 17A is an enlarged sectional view of one of these devices.

FIGS. 18A to 18E are sectional views illustrating the fabrication steps of the photo-device according to the order of the steps. First, as in the fourth embodiment, an $n^+$-type impurity diffused layer 52 is formed on the lower surface of an i-type silicon substrate 51. A plurality of p-type impurity diffused layers DF1 (only one is shown) are formed on the upper surface of the substrate 51 by using a mask pattern (not shown). An $n^+$-type impurity diffused layer DF2 (impurity concentration $1 \times 10^{19}$ cm$^{-3}$ or higher) is formed in the p-type impurity diffused layer DF1 by using a mask (not shown). A passivation film PF1 which is formed by stacking an SiN film on an SiO$_2$ film is formed on the entire surface, and an opening is formed in the surface of the p-type diffused layer DF1

Figure 18A:
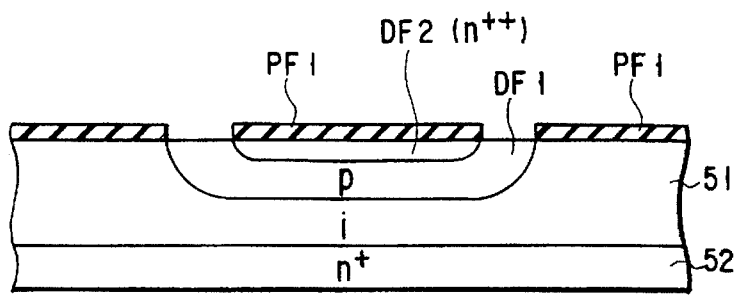
FIGS. 18A to 18E are sectional views showing the fabrication steps of the photocoupler of the fifth embodiment following the order of the steps.
Figure 18B:
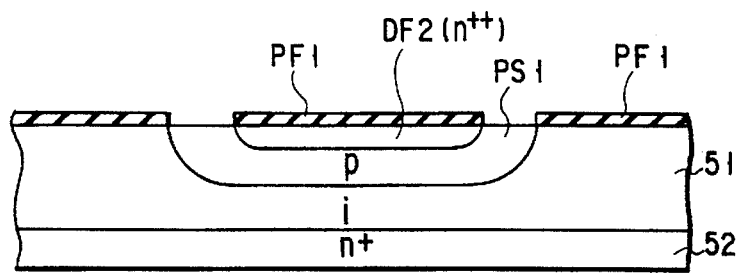

Subsequently, a p-type porous silicon layer PS1 which is to serve as a thermally oxidized porous silicon layer 53 is formed by making the p-type impurity diffused layer DF1 porous. This is accomplished by dipping the substrate into a hydrofluoric acid solution and irradiating the substrate with light (FIG. 18B).

Figure 18C:
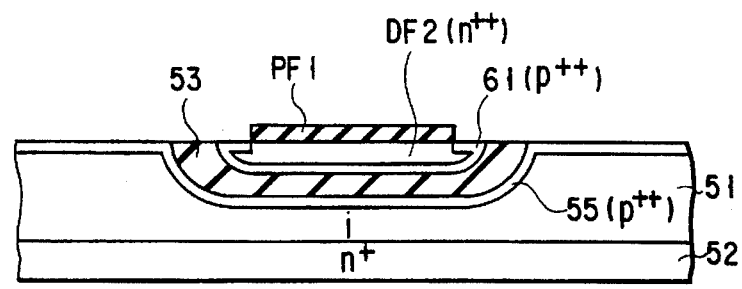

The passivation film PF1 is etched away from the surface of the substrate except for a portion on the $n^{++}$-type impurity diffused layer DF2. Subsequently, as in the fourth embodiment, $p^{++}$-type impurity diffused layers 55 and 61 are formed by using a liquid diffusing agent. Thereafter, the p-type porous silicon layer PS1 is oxidized to form a thermally oxidized porous silicon layer 53 (FIG. 18C).

Figure 18D:
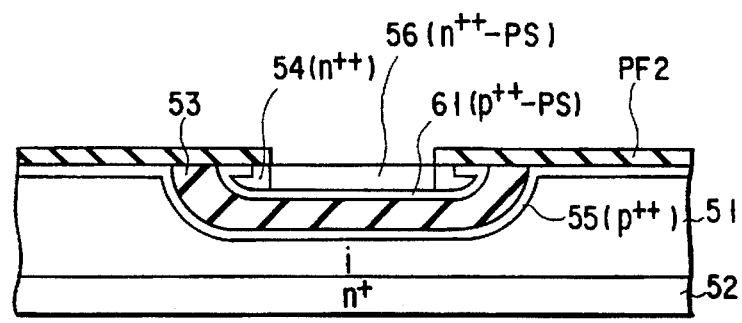
Figure 18E:
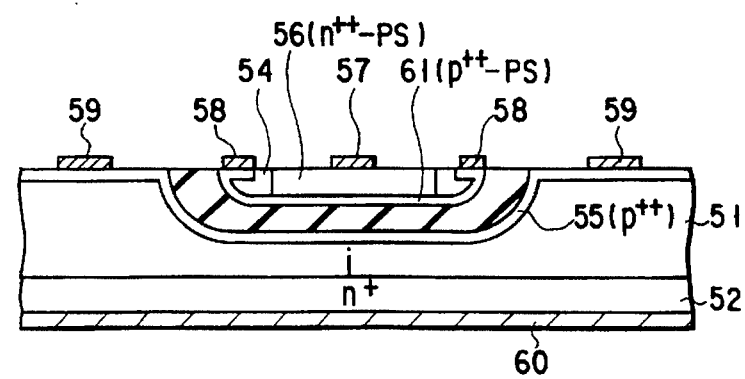

The passivation film PF1 is then removed, and a new passivation film PF2 is formed to cover the substrate except for a region in which an $n^{++}$-type porous region 56 is to be formed. In this state, anodization is performed to form an $n^{++}$-type porous silicon layer 56 in a silicon island isolated by the thermally oxidized porous silicon layer 53. The anodization is so performed as to proceed across a p-n junction formed by the $n^{++}$-type impurity diffused layer DF2 and the $p^{++}$-type impurity diffused layer 61 in the silicon island. Thereafter, a thick oxide film is formed as in the first embodiment. The surface of the $n^{++}$-type porous silicon layer 56 is etched to expose the top surface of an $n^{++}$-type silicon wire. Consequently, a good charge injection luminescence is obtained by virtue of the p-n junction (FIG. 18D).

Lastly, input electrodes 57 and 58 and output electrodes 59 and 60 are formed, completing the photocoupler (FIG. 1BE).

By the use of the above fabrication steps, it is possible to form not only the porous silicon oxide layer 53 but the light-emitting element in the substrate. In addition, since the light-emitting element can be formed with a single-crystal silicon layer containing an impurity at a high concentration, the light-emitting element can be given good luminescence characteristics explained in the first embodiment.

(Sixth Embodiment)

Figure 19:
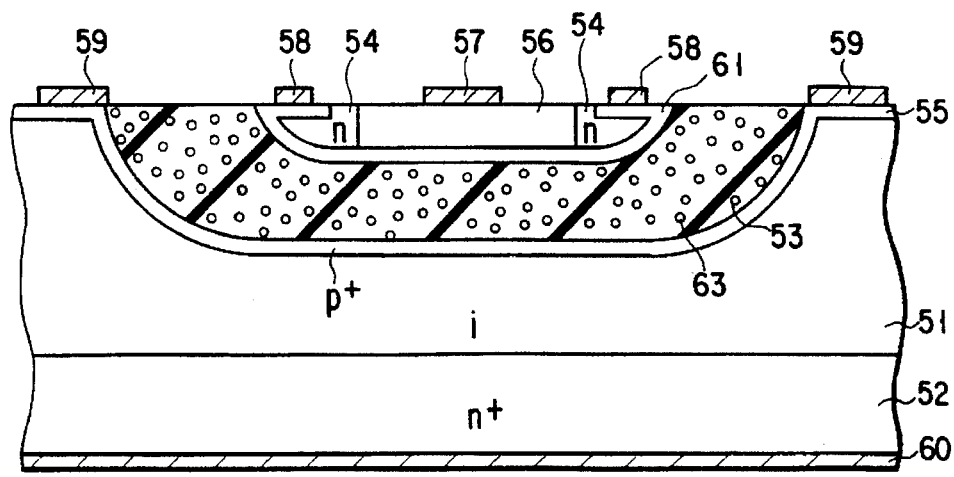
FIG. 19 is a sectional view of the photocoupler according to the sixth embodiment of the present invention.

FIG. 19 is a sectional view showing the photo-device (photocoupler) according to the sixth embodiment of the present invention. The sixth embodiment is a modification of the fifth embodiment.

This embodiment differs from the fifth embodiment in that a transparent insulating substance 63 is filled in pores of a thermally oxidized porous silicon layer 53. A silicone resin or silicate glass is preferable as the transparent insulating substance 63. The pores of the thermally oxidized porous silicon layer 53 cause scattering of light. Therefore, when these pores are filled with the insulating substance 63 having similar index of refraction to the silicon layer 53 as in this embodiment, the scattering of light is reduced. This improves the optical coupling efficiency.

The pores are increased in the step of thermally oxidizing the porous silicon layer, which serves as the thermally oxidized porous silicon layer 53, by impregnating the porous silicon layer with a diffusing agent, if, for example, after predeposition of boron, the surface oxide film is removed by hydrofluoric acid and additional oxidation is performed. In this case the surface oxide film of the porous silicon layer also is removed in removing the oxide film with hydrofluoric acid. This results in a higher porosity of the porous silicon layer than usual, leaving behind pores even after the thermal oxidation.

Note that the optical coupling efficiency improving method using the transparent insulating substance is also applicable to the previous other embodiments and to the embodiment described below.

(Seventh Embodiment)

Figure 20:
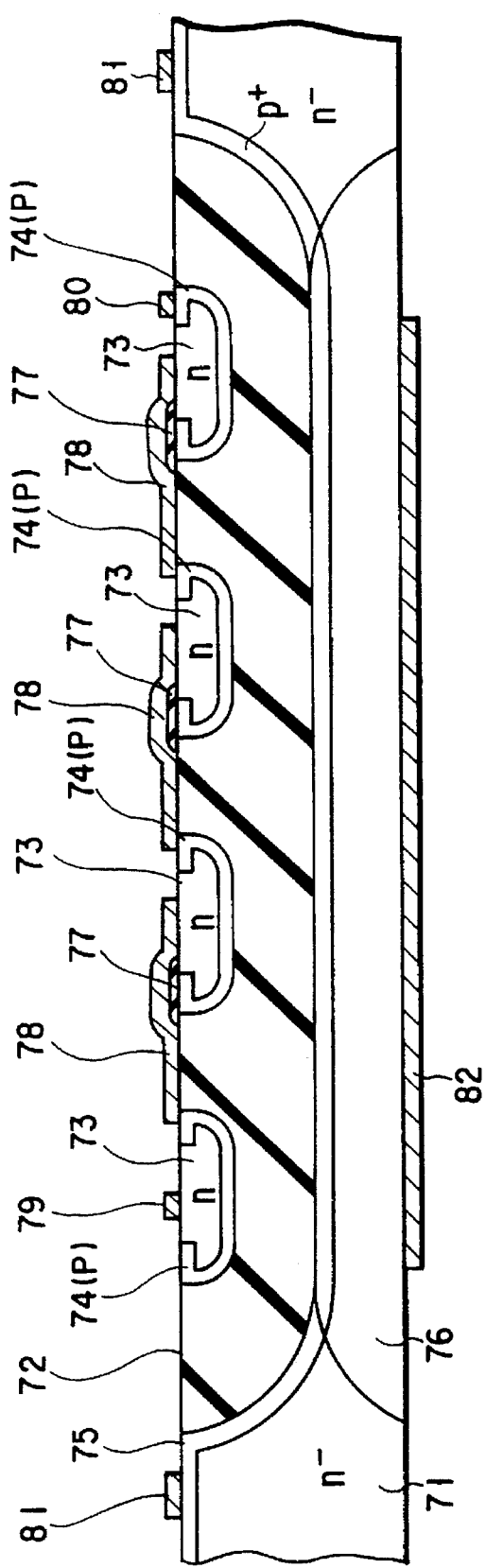
FIG. 20 is a sectional view of the photocoupler according to the seventh embodiment of the present invention.

FIG. 20 is a sectional view of the photo-device (photocoupler) according to the seventh embodiment of the present invention. The photocoupler of this embodiment is characterized by forming a plurality of series photodiodes as light-emitting elements in a thermally oxidized porous silicon layer.

The photocoupler of this embodiment will be described below following the order of fabrication steps. First, a p-type impurity diffused layer (not shown) to serve as a thermally oxidized porous silicon layer 72 is formed on an $n^-$-type silicon substrate 71.

N-type impurity diffused layers 73 to serve as n-type layers of a plurality of photodiodes are selectively formed on the surface of the p-type impurity diffused layer. The p-type impurity diffused layer is then selectively changed into porous silicon, forming a p-type porous silicon layer.

Subsequently, the p-type porous silicon layer is impregnated with a diffusing agent, forming $p^+$-type impurity diffused layers 74 as p-type layers of the photodiodes and a p-type impurity diffused layer 75. Thereafter, the p-type porous silicon layer is thermally oxidized to form a thermally oxidized porous silicon layer 72 as an insulating layer having a wavelength converting function.

A porous silicon layer 76 as a light-emitting layer is formed from the back side of the substrate to extend through the p-n junction. A passivation film 77 is formed on the side of the light-receiving element.

Subsequently, connecting electrodes 78 for connecting neighboring photodiodes are formed to connect a plurality of photodiodes in series. This makes it possible to obtain a high output voltage between output electrodes 79 and 80 (to be described below). For example, an output of 5 V or higher is attained by connecting 10 diodes in series.

Lastly, output electrodes 79 and 80 and input electrodes 81 and 82 are formed. The result is a photocoupler constituted by series-connected photodiodes. To simplify the explanation, the embodiment has been described by taking a regular photodiode as an example. However, it is, of course, possible to use the diode using a heavily doped porous silicon layer discussed in the first embodiment.

As in the previous embodiments, short-wavelength light from the light-emitting element is input to the photodiode after being wavelength-converted by the thermally oxidized porous silicon layer 72. This results in a higher optical coupling efficiency than those of conventional devices.

In addition, since the photodiodes are formed in the thermally oxidized porous silicon layer 72, they are insulated from each other by the layer 72. That is, each photodiode is connected to the neighboring photodiodes only via the connecting electrodes 78. This assures a series connection of these photodiodes. Consequently, the sum of the outputs from the individual photodiodes is reliably obtained as the output from the output electrode, resulting in a high-voltage output (e.g., 5 V or higher).

This photocoupler capable of a high-voltage output can be used in place of an external power supply of a power MOSFET. Consequently, the power MOSFET and the photocoupler can be integrated on the same substrate, making a monolithic structure of the power MOSFET and the power supply feasible.

It is also possible to form the photocoupler and an output processing circuit, which consists of transistors and a CPU and processes the output of the photocoupler, on the same substrate, so that the output processing circuit performs processing such as arithmetic operations for the output from the photocoupler. In this case an optical input integrated circuit having an intelligent output is obtained.

To increase the light emission efficiency of the above photocoupler light-emitting device and the wavelength conversion light emission efficiency of the thermally oxidized porous silicon layer, it is also effective to form luminescent centers using an impurity as follows. The light emission efficiency can be particularly improved by doping an impurity or an impurity pair which forms an isoelectronic trap inside a porous silicon micro-structure or in the vicinity of the interface between the surface of the micro-structure and the surface passivation film.

More specifically, examples of the effective impurity other than C, Ge, and Pb are nearest neighbors pairs such as Zn—O, Ga—N, Ga—P, Al—P, B—N, Al—As, B—P, Ga—As, In—P, In—Sb, and In—As.

This technique is based on the results of the research made by the present inventors on EL obtained in the process of anodic oxidation of porous silicon in an electrolyte solution. That is, this research has revealed that when porous silicon is anodically oxidized in an electrolyte solution such as hydrochloric acid, EL with an exceedingly high efficiency is obtained during the process compared to EL resulting from the solid-phase junction discussed above.

The present inventors quantitatively evaluated this light emission efficiency for the first time and investigated the correlations of the light emission efficiency with the porous silicon fabrication conditions and with the anodic oxidation conditions.

FIG. 21 shows the results obtained by measuring the PL intensity (measured as a "PD current" which is the current of a photodiode) and a change in the anode voltage during anodic oxidation. That is, FIG. 21 is a graph showing the relationship between the anodic oxidation time and the PD current and the relationship between the anodic oxidation time and the anode voltage. In this example the maximum light emission intensity was obtained by an anodic oxidation time of about 12 min., so the present inventors performed the investigation in this maximum light emission intensity condition. The anode voltage rose slowly within the range over which luminescence was obtained and rose abruptly after the luminescence stopped.

The present inventors focused attention on the EL efficiency (maximum light emission efficiency $\eta$ max) when the maximum luminescence was obtained during the anodic oxidation. The result was that, as illustrated in FIG. 22, the maximum light emission efficiency increased with increasing anodization time of porous silicon under the same anodic oxidation current conditions (0.1 mA and 1.0 mA in FIG. 22).

In addition, as in FIG. 23, the maximum light emission efficiency increased as the current density of anodic etching increased for the same anodization time.

Also, as in FIG. 24, when porous silicon was oxidized under the same anodization conditions (the current density, the anodization time) while the anodic oxidation current density was varied, the maximum light emission efficiency increased significantly as the injection current (oxidation current density) decreased. It turns out from the results of these experiments that in order to obtain a high EL efficiency, it is preferable that the thickness of the porous silicon film be large and the injection current density in anodic oxidation be low.

The present inventors have also found that the maximum light emission efficiency is uniquely determined by the rising speed ($dVa0/dt$) of the anode voltage ($Va0$) during anodic oxidation. FIG. 25 shows the relationship between the two. In FIG. 25, the straight line indicates a regression line for $Y=0.0130205X^{-0.33}$. As in FIG. 25, the maximum light emission efficiency abruptly decreased as the anodic voltage rising speed rose. This indicates that the external light emission efficiency of EL increases with decreasing anode voltage rising speed. This anode voltage rising speed is linearly proportional to the anodic oxidation current density in porous silicon under fixed anodization conditions. This demonstrates that the anode voltage rising speed represents the effective charge injection density on the surface of a porous silicon micro-structure.

From these facts, it turns out for the first time that the EL intensity during the anodic oxidation process is governed by the effective charge injection density to the surface of a porous silicon micro-structure and decreases with increasing current density in all the current density ranges (0.1 to 10 mA/cm$^2$) herein mentioned.

This light emission efficiency saturation phenomenon with respect to the injection current density is known in a GaP LED and considered to be derived from saturation of deep luminescent centers during the process of recombination of excitons via the luminescent centers.

That is, luminescent recombination is caused after electrons are trapped (localized) from the conduction band into a relatively deep localized state. Therefore, at low injection densities these trapped electrons are difficult to reemit, and this results in a high light emission efficiency. In contrast, as the injection density rises the saturation of luminescent centers takes place, since the luminescent centers are finite and the recombination probability is not high. The result is a decrease in the light emission efficiency.

These findings obtained by the present inventors strongly suggested for the first time that this recombination mechanism has a dominant effect in porous silicon. On the basis of this suggestion, the present inventors made extensive studies on the method of improving the EL efficiency and considered that in addition to decreasing the effective injection current density, increasing the density of luminescent centers that were currently assumed to be saturated was effective.

Along the line, the present inventors tried doping of an impurity or an impurity pair which was isoelectronic but had a function of trapping carriers by the difference between electronegativities, rather than a usual impurity such as boron or phosphorus. By this method it was possible to obtain a light-emitting layer with a higher light emission efficiency than those of conventional light-emitting layers. This fabrication method will be described in detail below.

As the most basic method, a high-energy ion implantation apparatus was used to ion-implant carbon or oxygen into porous silicon formed as a light-emitting element or as an insulating isolation layer. In this ion implantation, the acceleration energy was set to 1 MeV, and the dose was set to $10^{17}$ $cm^{-3}$. These conditions, of course, are merely examples, so it is possible to adjust the acceleration energy or the dose in accordance with the thickness of a porous silicon layer. It was also effective to vary the acceleration energy during the ion implantation so that ions were evenly doped in the direction of film thickness of the porous silicon.

The atoms to be ion-implanted are not restricted to those enumerated above. Any atom can be used as long as it forms an isoelectronic trap in the porous silicon micro-structure. Pb and Ge are examples. After the ion implantation, damages caused by the ion implantation were recovered by a heat treatment, and oxygen passivation was performed on the surface of the porous silicon. This heat treatment was done by rapidly increasing the temperature to 900° C. in a nitrogen-oxygen mixed atmosphere and holding the temperature for 30 sec. to 30 min. The heat-treatment temperature can be chosen from 800° to 1200° C., so the temperature was chosen in combination with the heat-treatment time so that the light emission intensity was a maximum.

In the sample formed as above, the impurity was distributed over the concentration range of $1 \times 10^{17}$ to $1 \times 10^{20}$ $cm^{-3}$ inside the silicon micro-structure and in the vicinity of the interface between the silicon micro-structure and the surface passivation film.

Figure 26:
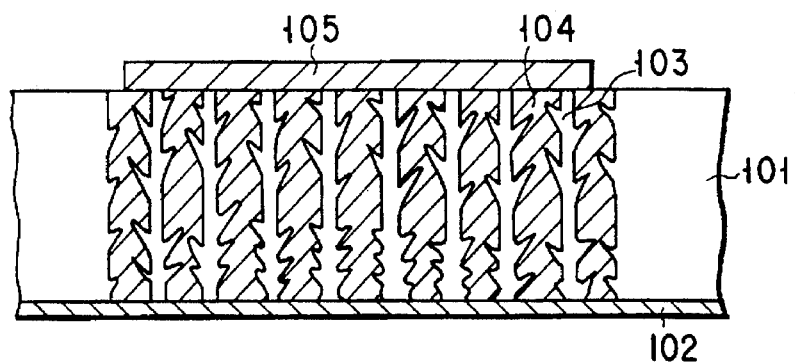
FIG. 26 is a sectional view showing the micro-structure of porous silicon according to the present invention.

A light-emitting device was fabricated by using the porous silicon thus formed. FIG. 26 shows an example of the device. As the charge injection layer, an immersion type charge injection layer 104 formed by electrolytic polymerization was used. In FIG. 26, reference numeral 101 denotes a silicon substrate; 102, an ITO layer; and 103, silicon micro-skeletons (silicon wires) formed in the porous silicon.

More specifically, a film of polyaniline or polypyrrole was formed. In this embodiment, pyrrole was dissolved in acetonitrile (containing 1% of water), and $[(CH_3CH_2)_4N]ClO_4$ or $[(CH_3CH_2)_4N]BF_4$ was used to dope counterions ($ClO_4$- or $BF_4$-). The molar ratio of the electrolyte to the pyrrole was 1:1. The current density was 2 $mA/cm^2$, the time was 40 sec., and the temperature was 0° C.

Figure 27:
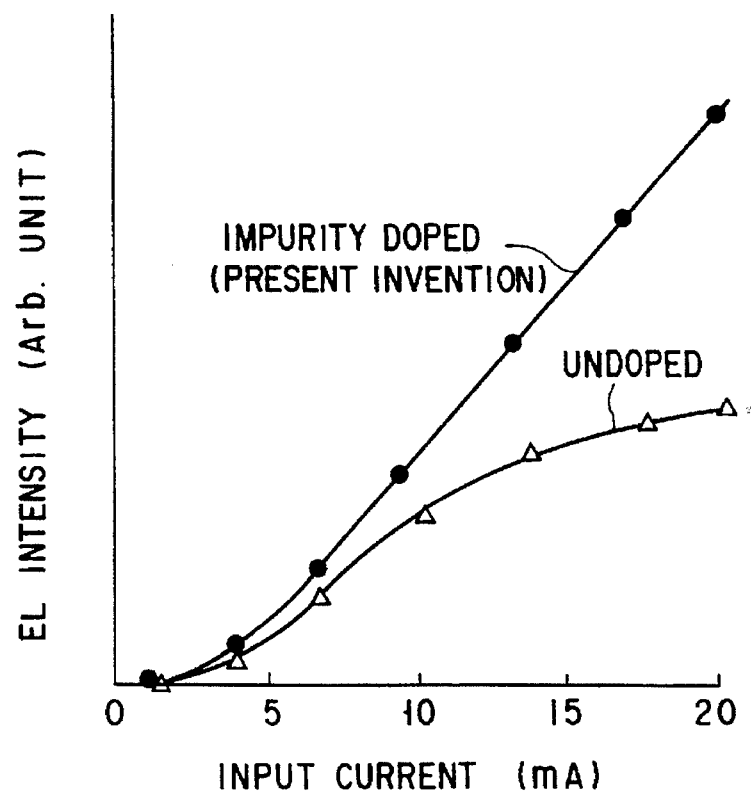
FIG. 27 is a graph showing the relationships between the input current and the EL intensity when an impurity is doped and when no impurity is doped.

FIG. 27 shows the relationships between the input current and the EL intensity of the device doped as discussed above and the undoped device. It is evident from FIG. 27 that in the EL device according to the present invention, an increase in the EL intensity was not saturated up to a larger current than in the undoped device, and a higher luminescent output was obtained.

The impurity doping can also be performed by a dipping method rather than by the ion implantation. That is, after porous silicon is formed, pores of the porous silicon are impregnated with an aqueous solution containing atoms of interest such as carbon atoms. The resultant micro-structure is made contain these atoms by a heat treatment, and doping is performed by activating the atoms. In the case of acidic atoms such as carbon atoms, the heat treatment is done in a nonacidic atmosphere and, after doping of interest is performed, an oxidizing heat treatment for surface passivation is performed. This method is possible since the surface area of porous silicon is very large, and since the depth (the distance from the surface to the core) of the silicon micro-structure is small, i.e., at most several nanometers to a few tens of nanometers. This obviates the need for a high installation cost, unlike when an ion implantation apparatus is used.

In the above method, the doping can be promoted by application of an electric field in addition to impregnation. That is, in forming a Zn—O nearest neighbors pair, for example, porous silicon is dipped into an aqueous solution of zinc chloride ($ZnCl_4$) containing Zn ions, polarizing the porous silicon to a cathode. Consequently, the Zn ions are actively incorporated into the porous silicon, and the result is a higher doping concentration than when impregnation alone is done. In the case of Zn ion, oxygen is further doped by ion implantation or by oxygen addition during the heat treatment, in order to form a nearest neighbors pair with the oxygen.

The type of nearest neighbors pair is not limited to the above mentioned one. That is, any nearest neighbors pair can be used as long as the pair is capable of forming an isoelectronic trap. Examples of the nearest neighbors pair are Ga—N, Ga—P, Al—P, B—N, Al—As, B—P, Ga—As, In—P, In—Sb, and In—As.

Furthermore, in all of the previous embodiments it is possible to perform anodization with a low current density or under dark conditions by which no PL is produced after the anodization, and to decrease the pore size by conversion to a micro-structure oxide film when thermal oxidation is performed during doping, thereby obtaining PL for the first time after this pore size reduction. In this method, the heat treatment can be sufficiently performed during the doping.

In addition, it is possible to increase the light emission efficiency by performing anodic oxidation after the anodization at the low current density as mentioned above or in the dark condition, thus making micro-structure finer. In this case, it is preferable to cease the anodic oxidation before EL in the oxidation process quenches. It is effective to perform the oxidation at the oxidation current density which exceeds the saturation amount of the total injection current until EL quenching. Further, repetition of oxidation after etching the pre-oxidized layer may be also effective to obtain finer structure.

In addition to doping, forming an immersion type charge injection electrode is also effective as the method of decreasing the effective charge injection density discussed above. That is, a metal layer is formed in pores of porous silicon by dipping the porous silicon into a metal plating solution of, e.g., nickel, gold, platinum, palladium, or copper, and performing constant-current electrolysis. Consequently, it is possible to realize an injection structure with an extremely low resistance and a large effective charge injection sectional area.

When nickel is used, a nickel layer is formed by dipping porous silicon into a well-known nickel-plating bath containing a solution mixture of nickel sulfate, nickel chloride, and boric acid, and performing constant-voltage electrolysis by using the porous silicon as a cathode. During the plating, the current density is set to between 10 $\mu A/cm^2$ and 10 $mA/cm^2$. When a p-type substrate is used, uniform, good plating is impossible without irradiation of light.

Figure 28A:
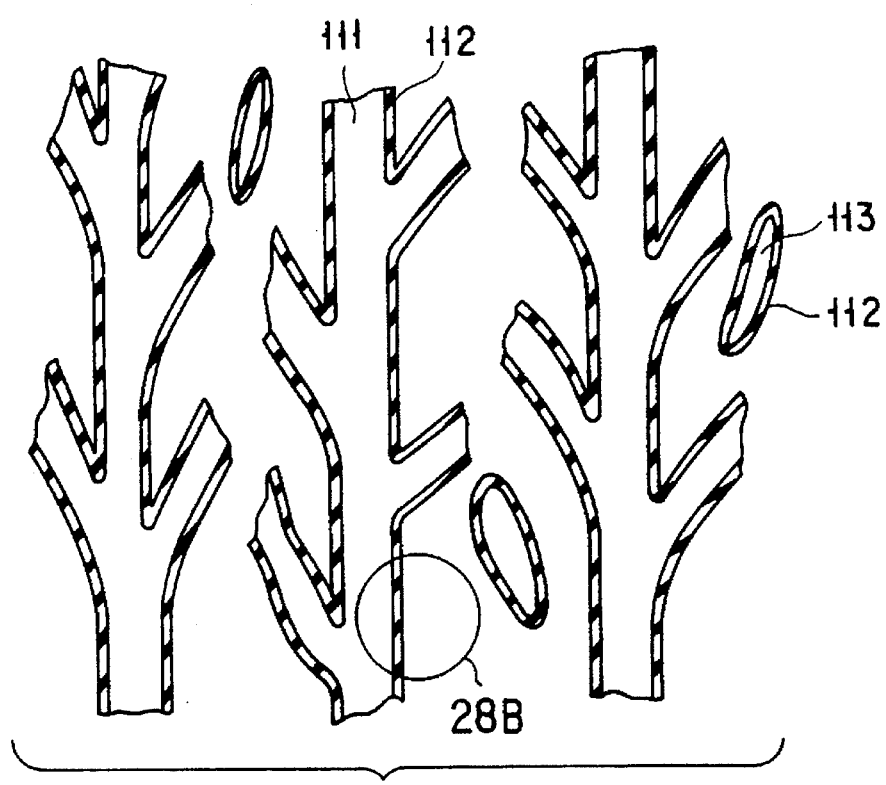
Figure 28B:
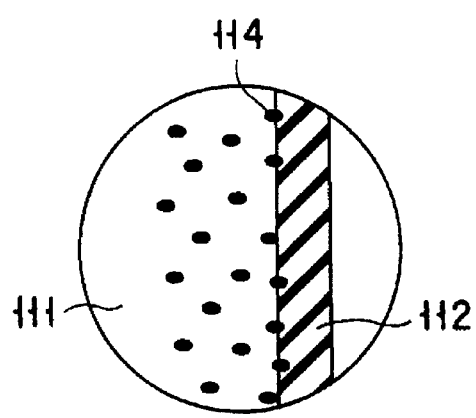

In either way, the effective charge density in the charge injection interface can be greatly decreased, with the same current flowing, by the use of the immersion type structure in comparison to a structure in which a charge injection layer is simply stacked on the surface of a porous silicon layer. This singly can reduce the saturation of luminescent centers discussed above. That is, from this phenomenon it is possible to think of luminescent centers as primarily existing, or being effective, in the interface (in the vicinity of the surface) where external injection takes place, as illustrated in FIG. 28B, rather than as existing in the current path inside the silicon micro-structure. In FIGS. 28A and 28B, reference numeral 111 denotes silicon wires; 112, a surface passivation film; 113, silicon dots; and 114, a localized luminescent center forming impurity.

In all of the previous embodiments, it is possible to decrease the effective injection current density and improve the light emission efficiency by increasing the thickness of the porous silicon layer as large as possible. More specifically, the film thickness is about 5 µm under standard conditions of 20 $mA/cm^2$ and 5 min. However, the light emission efficiency can be greatly improved by increasing the thickness to 50 µm or larger, preferably 100 µm or larger, and more preferably 200 µm or larger. In this case, as in the above-mentioned case, the efficiency of a doped device, of course, is higher than that of an undoped device.

As discussed above, by increasing luminescent centers by doping or by using an immersion type charge injection layer or a thick porous silicon layer, it is possible to improve the light emission efficiency, particularly the efficiency of EL obtained by charge injection in comparison to those obtained by conventional devices.

This is done on the basis of the knowledge found by the present inventors that the EL efficiency is dominated by the effective charge injection density on the surface of a porous silicon micro-structure, that this is derived from the exciton luminescent recombination process via a deep localized state, and that the light emission efficiency decreases due to saturation of luminescent centers.

Consequently, the decrease in the light emission efficiency is reduced up to large currents compared to the case when none of these treatments is performed. As a result, the light emission efficiency in an actual use current region can be improved.

In addition, selecting the type of luminescent center allows adjustment of the energy gap of luminescent transition, i.e., the wavelength of luminescence. This make it possible to fabricate EL devices having various luminescence wavelengths.

Details of the method of forming a micro-structure capable of decreasing the injection current density by increasing the surface area of a porous silicon layer will be described below. In the eighth to 13th embodiments a silicon substrate having impurity concentration of less than $1\times10^{19}$ $cm^{-3}$ is used on the contrary to the first to sixth embodiments, and the oxidation layer thereof is formed by anodic oxidation. The eighth to 13th embodiments have features in silicon micro-skeleton formation methods, especially in charge injection layers, resultant improved light emission efficiency and mechanical strength.

(Eighth Embodiment)

FIGS. 29A to 29D are sectional views showing the fabrication steps of the semiconductor device according to the eighth embodiment of the present invention following the order of the steps. The semiconductor device of this embodiment has a structure, FIG. 29D, in which an oxide film 124 is formed on silicon wires 123 formed on a silicon substrate 121, and a charge injection layer 125 is so formed as to bury the gaps between the silicon wires 123, such that a charge is uniformly injected from the silicon surface whose area is increased by making the surface porous. The fabrication steps will be described below according to the order of the drawings.

Figure 29A:
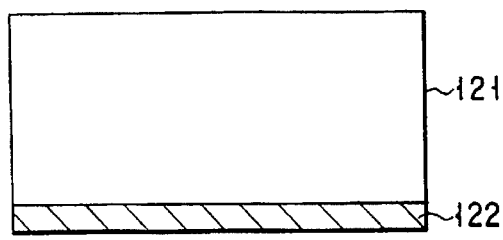
FIGS. 29A to 29D are sectional views showing the fabrication steps of the semiconductor device according to the eighth embodiment of the present invention following the order of the steps.

First, a p-type mirror-surface substrate having a major surface orientation of (100) and a volume resistivity of 10 µm is prepared as the silicon substrate 121. A 300-nm thick Al electrode 122 is vapor-deposited on the lower surface of the substrate 121 (FIG. 29A). To form an ohmic contact, sintering is performed in a gas mixture of nitrogen and oxygen. The sintering temperature is 470° C., and the heating time is 20 min.

Figure 29B:
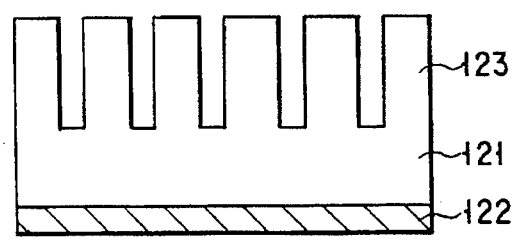

The lower surface and the side surfaces of the substrate 121, excluding the surface which is to be anodized, are covered with a protection tape, and the substrate is anodized in a hydrofluoric acid-based solution. As the hydrofluoric acid solution, a 2:3 (volume ratio) mixture of hydrofluoric acid (49% solution) and ethanol is used. The anodization is performed by illuminating with an incandescent lamp at a close distance with a current density of 20 $mA/cm^2$ for 5 min. by using a platinum ribbon as a counter electrode of the silicon anode. In this manner, silicon wires 123 with an average height of 10 µm and an average width of 10 nm are formed on the silicon substrate 121 (FIG. 29B). The average width of the gaps between the silicon wires 123 is 10 nm. The anodization conditions are not limited to the above conditions. That is, it is only necessary that the current density be 5 to 100 $mA/cm^2$ and the anodization time be 1 to 60 min. It is also possible to perform anodization by using a photoelectromotive force without forming any electrode on the back side.

Figure 29C:
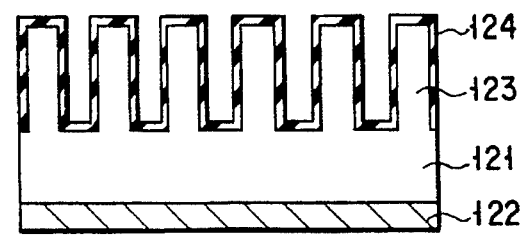

Subsequently, the sample is transferred into 1-mol/l hydrochloric acid used as a non-etching electrolyte, and anodic oxidation is performed. In this case the sample is transferred in a wet state in which its surface is covered with water. During the anodic oxidation, the current density is set at 0.5 mA with respect to the surface area of the silicon substrate 121 before the anodization. A point at which the applied voltage rises 1 V from the value immediately after the start of the oxidation is determined as the end point of the oxidation. In this way, a 3-nm thick anodically oxidized film 124 is formed on the surfaces of the silicon wires 123 (FIG. 29C).

Note that an organic solvent can also be used as the solution for wetting the sample after the anodic oxidation. It is also possible to use $HNO_3$ as the non-etching electrolyte. The anodic oxidation conditions are not restricted to the above conditions. That is, it is only necessary that the current density range from 10 μA/cm² to 10 mA/cm², and the voltage rise at the conclusion of the oxidation range between 1 and 20 V. Additionally, the thickness of the anodically oxidized film 124 is preferably 3 nm or smaller in order to increase the light emission efficiency.

Figure 29D:
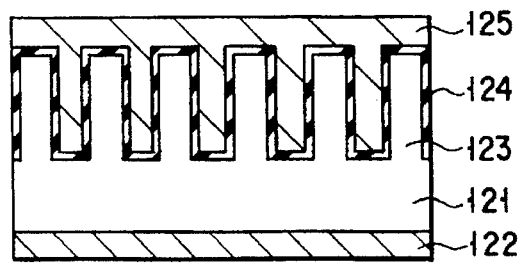

Subsequently, a charge injection layer 125 is filled by using an electrolytic plating method (FIG. 29D). In this embodiment, an acidic nickel-plating solution (nickel sulfate+nickel chloride+boric acid) is used in order to fill Ni as the charge injection layer 125. To begin with, the sample is transferred to the plating bath with its surface covered with water or with an organic solvent. Plating is done at a temperature of the plating bath of 50° C. and a current density of 5 mA/cm² while the plating solution is stirred. Platinum is used as the counter electrode.

When a p-type semiconductor is used as in this embodiment, light is necessarily irradiated during plating. Irradiation of light is unnecessary when the semiconductor is of n-type. In the case of p-type, however, irradiation of light produces electrons, as the minority carriers, in the silicon wires 123. No uniform plating is possible without a photocurrent resulting from these electrodes.

When the device is to be used as an EL device, the charge injection layer 125 is so formed as to cover a minimum necessary amount of the upper portion of each silicon wire 123, in order that the emission of light is not interfered with.

The material of the charge injection layer 125 is not limited to Ni, but any conductive material capable of being plated can be used. Examples are Au, Pt, In, Pd, Ag, and Cu. Alloys of these metals are also usable. In addition, electroless plating can be used instead of electrolytic plating. As an example, nickel plating can be performed by dipping a substrate into an aqueous solution of sodium hypochlorite+ sodium acetate+nickel sulfate held at 90° C. in an acidic bath.

In this manner the semiconductor device according to this embodiment is completed.

This semiconductor device has electrical conductivity at least twice that of a conventional semiconductor device which is fabricated under the same anodization conditions and in which a charge injection layer is formed by a thin film formation method. The uniformity of the charge injection layer in the silicon micro-skeleton of this semiconductor device is also better than that of the conventional device. Consequently, when used as an EL device, the semiconductor device of this embodiment luminesces upon application of a voltage of several volts or higher. The resulting luminescence is uniform and free from variations or spots that are often found in luminescence by conventional devices.

In addition, since the charge injection layer is uniformly filled, the mechanical strength of the device is significantly increased. The micro-skeleton structure of a conventional device is in many cases broken to short the device when a probe is brought into contact with the device. However, the device of the present invention less causes a short circuit when brought into contact with a probe. Also, when this semiconductor device is used as a rectification device, the resulting current-voltage characteristics are stabler than those obtained by conventional semiconductor devices.

Note that the state of formation of the anodically oxidized film 124 changes in accordance with the setting of the voltage at the end of the anodic oxidation, and the filled state of the charge injection layer 125 changes accordingly. When the anodic oxidation is done with a fixed current, the applied voltage slowly rises up to about 1 V with reference to the platinum counter electrode and then starts rising abruptly. That is, the threshold point of the abrupt voltage rise is present at about 1 V. EL in the anodic oxidation starts some time after the oxidation is started and ends at this threshold point.

When the oxidation is done beyond this threshold point, the charge injection layer 125 tends to be filled from the vicinities of the bottom portions between the silicon wires 123. When the oxidation is stopped before the threshold point, the charge injection layer 125 tends to grow from the upper portions of the silicon wires. The former case is advantageous in the electrical conductivity, and the latter case is advantageous in the light emission efficiency. However, in either case the micro-skeleton structure can be strengthened.

(Ninth Embodiment)

FIG. 30 is a sectional view of the semiconductor device according to the ninth embodiment of the present invention. As in FIG. 30, in this semiconductor device a 1-μm thick ITO layer 126 is formed by RF magnetron sputtering on top of the charge injection layer 125 of the semiconductor device according to the eighth embodiment.

The ITO layer 126 is formed in order to increase the efficiency of light extraction from the upper portion of the device, allowing for the application of the device as an EL device. For the same reason, the thickness of the charge injection layer 125 which covers silicon wires 123 is minimized.

(Tenth Embodiment)

The structure of the semiconductor device according to the tenth embodiment of the present invention is identical with that of the eighth embodiment except that a charge injection layer 125 is made from ITO.

The fabrication steps of this embodiment are the same as those of the eighth embodiment from FIGS. 29A to 29C. In the step of forming the charge injection layer 125, however, ITO is injected using thermal decomposition of an organic metal, instead of using the plating method. After the formation of an anodically oxidized film 124, the sample is dipped into acetone and then into toluene. Subsequently, the sample is dipped into a toluene solution of an alcoholate of In and Sn, dried, and heat-treated, thereby forming the ITO charge injection layer 125.

(11th Embodiment)

FIG. 31 is a sectional view of the semiconductor device according to the 11th embodiment of the present invention. This semiconductor device is fabricated by etching a charge injection layer 125 of the completed semiconductor device of the eighth embodiment, by using an RIE process, until silicon wires 123 are exposed, and forming a 1-μm thick ITO layer 126 by RF magnetron sputtering.

With this structure, charge injection from the top of the micro-skeleton structure is encouraged to increase the charge recombination probability. This further increases the light emission efficiency when the device is used as an EL device.

(12th Embodiment)

FIGS. 32A to 32D are sectional views showing the fabrication steps of the semiconductor device according to the 12th embodiment of the present invention following the order of the steps. The characteristic feature of this semiconductor device is that a p-n junction is formed in a silicon wire. The semiconductor device of this embodiment will be described below according to the order of the drawings.

Figure 32A:
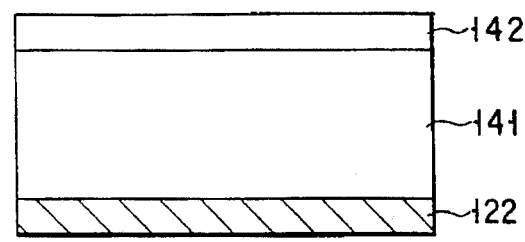
FIGS. 32A to 32D are sectional views showing the fabrication steps of the semiconductor device according to the 12th embodiment of the present invention following the order of the steps.

First, a 5-μm thick p-type silicon layer 142 is formed on a 500-μm thick n-type silicon substrate 141 by low-pressure CVD. A 300-nm thick Al electrode 122 is vapor-deposited on the surface of the silicon substrate 141 away from the surface on which the p-type silicon layer 142 is formed (FIG. 32A).

Figure 32B:
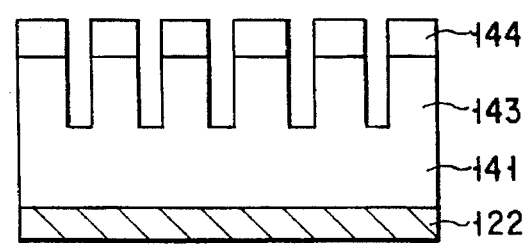

Anodization is performed under the same conditions as in the eighth embodiment, forming silicon wires each consisting of an n-type silicon micro-skeleton 143 and a p-type silicon micro-skeleton 144 (FIG. 32B).

Figure 32C:
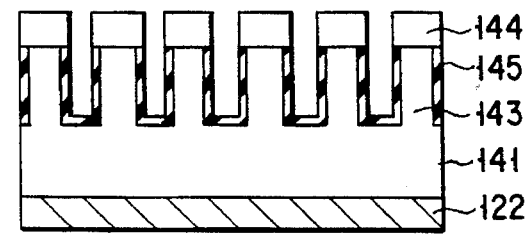

Subsequently, anodic oxidation is performed under the same conditions as in the eight embodiment, forming an anodically oxidized film 145. Note that in this embodiment, this step is done in the dark (FIG. 32C).

Figure 32D:
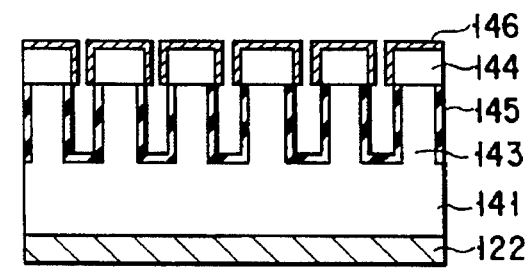

Following the same procedure as in the eighth embodiment, a charge injection layer 146 is formed on the p-type silicon micro-skeletons 144 (FIG. 32D).

In this embodiment, charge recombination occurs efficiently in the p-n junctions inside the silicon wires. Consequently, the light emission efficiency rises when the device is used as an EL device.

(13th Embodiment)

FIG. 33 is a sectional view of the semiconductor device according to the 13th embodiment of the present invention. This semiconductor device differs from the semiconductor device of the 12th embodiment in a charge injection layer. The fabrication steps from FIGS. 32A to 32C are identical with those of the 12th embodiment. However, no irradiation of light is done in the formation of a charge injection layer. Consequently, a charge injection layer 155 is formed on both of n-type silicon micro-skeletons 143 and p-type silicon micro-skeletons 144. In this case the charge injection layer is preferentially formed on the p-type silicon micro-skeletons 144.

In this embodiment, as in the 12th embodiment, charge recombination efficiently takes place in the p-n junctions inside the silicon wires, and this increases the light emission efficiency when the device is used as an EL device.

In the previous eighth to 13th embodiments, any method other than those discussed in these embodiments can be used as the charge injection layer filling method, provided that the method is capable of filling a liquid or a gas in fine pores or gaps, into which neither a liquid nor a gas can enter by common thin film forming means, and forming a conductive substance serving as a charge injection layer by the subsequent reaction. Practical examples of the method are an electrolytic polymerization method, an impregnation method, and a pressure method.

Examples of the material usable as the conductive substance serving as a charge injection layer are, in addition to those discussed above, $SnO_2$, $TaO_5$, $In_2O_3$, SiC, tin oxide added with niobium, InP, GaAs, GaN, and GaAlAs.

As the electrode formed on the back side of the substrate, it is possible to use Au, AuGe, Au/Ti, Au/Cr, and AlSi, in addition to Al.

Methods of forming a micro-skeleton in a layer primarily consisting of aluminum (Al) will be described below in the 14th to 16th embodiments.

(14th Embodiment)

FIGS. 34A to 34D are sectional views showing the fabrication steps of the semiconductor device according to the 14th embodiment of the present invention following the order of the steps. This semiconductor device will be described below according to the order of these drawings.

First, a p-type mirror-surface substrate having (100) orientation and a volume resistivity of 10 Ω.m is prepared as a silicon substrate 121. $B^+$ ions are doped into the lower surface of the substrate 121 to decrease the resistance of that portion, forming a 300-nm thick lower electrode 162.

A 500-nm thick Al film 167 is formed by RF magnetron sputtering on the surface of the silicon substrate 121 away from the surface on which the electrode 162 is formed. During the formation, the Al purity is so controlled as to be 99.99% or more (FIG. 34A).

Subsequently, the lower surface and the side surfaces of the silicon substrate 121 except for the surface to be anodically oxidized are covered with a protection tape, and the substrate is anodically oxidized in an electrolyte solution. Consequently, the Al layer 167 is oxidized and made porous, resulting in micro-skeletons 167a (FIG. 34B). These $Al_2O_3$ layers 167a are formed by using oxalic acid with a concentration of 0.6 mol/l as the electrolyte and performing the anodic oxidation at room temperature while applying a voltage of 3 V. The diameter of the pores is approximately 3.0 μm.

Note that an oxalic acid solution with a concentration of 0.1 to 1.1 mol/l can be used as the electrolyte solution. The voltage need only range from 1 to 10 V. The pore size decreases with increasing applied voltage. The pore size is preferably 2 to 100 nm to obtain a high light emission efficiency.

Subsequently, silicon is vertically grown in the pores formed in the previous step by using molecular beam epitaxy (MBE) at a growth rate of 23 nm/min. More specifically, $B^+$ ions are doped as an impurity in the early stages of the growth, and, when the growth proceeds to the vicinities of the upper portions of the $Al_2O_3$ layers 167a, $P^+$ ions are doped. The results are silicon wires each consisting of a 400-nm thick p-type silicon layer 163 and a 100-nm thick n-type silicon layer 164 (FIG. 34C). Note that the growth rate is not limited to the one in this embodiment but need only range between 1 and 300 nm/min.

Subsequently, a 1-μm thick ITO layer 126 is formed on top of the $Al_2O_3$ layers 167a by RF magnetron sputtering (FIG. 34D). In this manner, the semiconductor device of this embodiment is completed.

The semiconductor device fabricated as above has electrical conductivity at least twice that of a conventional semiconductor device in which a charge injection layer is formed by a thin film formation method. Also, when used as an EL device this semiconductor device can provide a uniform luminescence with an applied voltage of several volts or higher.

Furthermore, this semiconductor device is improved in the mechanical strength since the silicon layers 163 and 164 are supported by the $Al_2O_3$ layers 167a.

(15th Embodiment)

Figure 35:
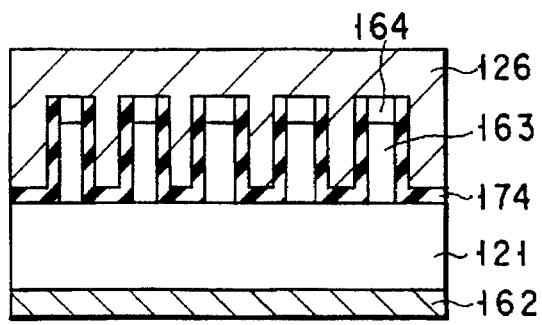
FIG. 35 is a sectional view of the semiconductor device according to the 15th embodiment of the present invention.

FIG. 35 is a sectional view of the semiconductor device according to the 15th embodiment of the present invention. In this embodiment, the light emission efficiency is increased by making the diameter of silicon wires 163 and 164 smaller than that in the 14th embodiment.

The fabrication steps of the semiconductor device of this embodiment from FIGS. 34A to 34C are identical with those of the 14th embodiment. After the step shown in FIG. 34C, $Al_2O_3$ layers 167a are dissolved away in an alkali solution to leave behind the silicon layers 163 and 164.

Subsequently, the pore size of the silicon layers 163 and 164 is decreased by repetitively performing oxidation in an oxygen atmosphere and etching by dipping into hydrofluoric acid. This step is performed because decreasing the pore size increases the charge recombination probability, and this consequently increases the light emission efficiency.

The side surfaces of the silicon layers 163 and 164 are covered with a 3-nm thick silicon oxide film 174. Lastly, a 1-μm thick ITO layer 126 is formed on top of the resultant device by using RF magnetron sputtering, thereby completing the semiconductor device.

This semiconductor device has a higher light emission efficiency than that of the 14th embodiment, since the diameter of the silicon layers 163 and 164 is smaller.

(16th Embodiment)

Figure 36:
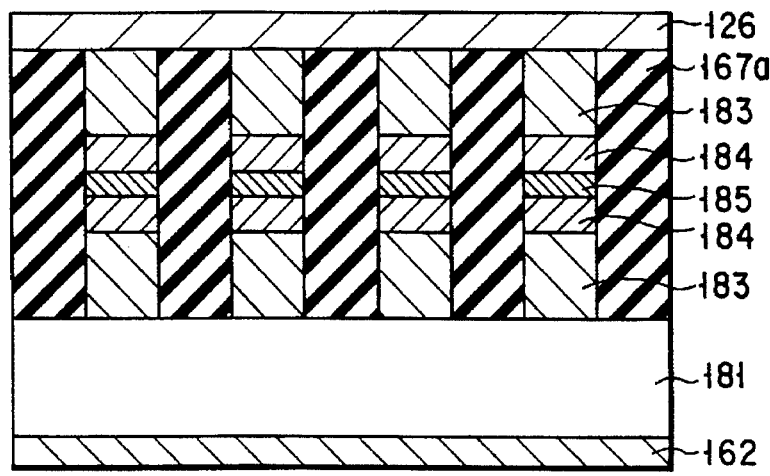
FIG. 36 is a sectional view of the semiconductor device according to the 16th embodiment of the present invention.

FIG. 36 is a sectional view of the semiconductor device according to the 16th embodiment of the present invention. In this semiconductor device, a GaAs substrate 181 is used in place of a silicon substrate. On this GaAs substrate 181, a microcavity laser is formed by sequentially stacking, instead of forming the silicon layers 163 and 164, a 288-nm thick Bragg reflecting layer 183 which is formed by alternately growing $Al_{0.15}Ga_{0.85}As$ and GaAs, a 1.2-nm thick $Al_{0.3}Ga_{0.7}$ spacer layer 184, a 0.12-nm thick GaAs active layer 185, a 1.2-nm thick spacer layer 184, and a 288-nm thick Bragg reflecting layer 183, by using molecular beam epitaxy (MBE). With this structure, it is possible to obtain a microcavity laser whose threshold value is small and light intensity is high.

In the eighth to 16th embodiments discussed above, Si or GaAs is used as the substrate. However, Ge, AlSb, AlAs, AlP, and GaP can also be used.

In the 14th to 16th embodiments, Ge, AlSb, AlAs, AlP, and GaP can be used as the material of the semiconductor wires.

The material of the ITO layer can also be another substance, such as Ni, Au, Pt, In, Pd, Ag, $CuSnO_2$, $TaO_5$, $In_2O_3$, SiC, tin oxide added with niobium, InP, GaAs, GaN, or GaAlAs. The electrode formed on the lower surface can be made from Al as in the eighth to 13th embodiments.

A porous silicon p-n junction structure which is formed from bulk p-n junction silicon manufactured under precise control, which is uniform and suitable for luminescence, and which has a good contact with a charge injection layer will be described below. Usually, anodization of silicon is performed using a mirror-polished silicon substrate. In the present invention, however, the surface of a substrate is processed and given surface roughness before anodization. The present inventors have found that this improves the uniformity of the anodization rate in the direction of the surface.

Figure 37:
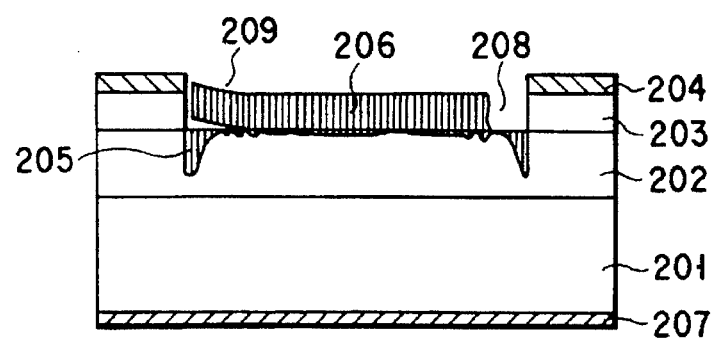
FIG. 37 is a sectional view of a semiconductor device for explaining a drawback of a conventional p-n junction porous silicon device.

More specifically, anodization normally proceeds rapidly near the edges of the anodized region. Consequently, in the section of the resultant porous layer the bottom tends to be recessed more and more toward the periphery. In addition, an n-type porous layer on the surface after the anodization peels and cracks significantly. FIG. 37 shows an example of the section of such a conventional porous layer. In FIG. 37, reference numeral 201 denotes a $p^+$-type silicon layer; 202, a $p^-$-type silicon layer; 203, an $n^+$-type silicon layer; 204, a mask layer; 205, a $p^-$-type porous silicon layer; 206, an $n^+$-type porous silicon layer; and 207, an electrode. Reference numerals 208 and 209 denote a peeled portion and a cracked portion, respectively, of the $n^+$-type porous layer 206. Note that in FIG. 37 and the subsequent drawings, porous silicon layers (205 and 206 in this embodiment) are indicated by a number of vertical stripes in order to readily distinguish from other layers. The present invention has solved the above conventional problems and thereby can make the thickness of the anodized layer uniform on the entire surface. It also turns out that this uniformity can be further improved remarkably by increasing the anodization current.

In a p-n junction substrate having an n-type layer on its surface, anodization normally stops at the n-type layer in almost all regions, so only the peripheral region of the anodized surface is selectively anodized to a p-type layer. In the present invention, this conventional drawback is significantly improved, and the anodized layer can be uniformly formed to the p-type layer on the entire surface. This makes it possible to obtain a porous silicon junction structure having a junction precision comparable to that of bulk silicon and a uniform film thickness.

Additionally, the surface roughness given to the surface prevents peeling and cracks of the anodized layer, and this stabilizes the porous layer. More specifically, even if no surface roughness is imparted, the nonuniformity of the film thickness can be reduced to some extent by increasing the current density. However, in the p-n junction formed in this way the surface n-layer in a region where anodization proceeds to the p-type layer is exceedingly unstable and hence readily cracks and peels upon a manipulation such as drying.

In contrast, when high-current-density anodization and surface roughness are combined as in the present invention, the uniformity of the film thickness is improved, and at the same time a stable porous silicon junction is formed in which the layer itself is stable to cause almost no peeling. Although this mechanism is uncertain, it is considered that the internal stress produced by the porous structure is reduced in a pattern like a bellows in individual local positions by the macro-structure consisting of projections and recesses, and this leads to a decrease in the strain as a whole. This improves not only the mechanical strength but also the electrical conductivity between the two layers, resulting in lower-resistance, stabler diode characteristics.

Furthermore, when a charge injection layer is formed by stacking, the surface roughness effectively forms a good contact with this electrode layer. By convention, it is in some cases not possible to form a good contact even when a charge injection layer is formed on the anodized surface. The present inventors have found that the use of the structure of the present invention can reduce the contact resistance with the charge injection layer and simultaneously increase the adhesion strength of the layer, and this makes it possible to form a stable, high-strength charge injection layer.

The above invention will be described in detail below in the 17th to 21st embodiments.

(17th Embodiment)

Figure 38:
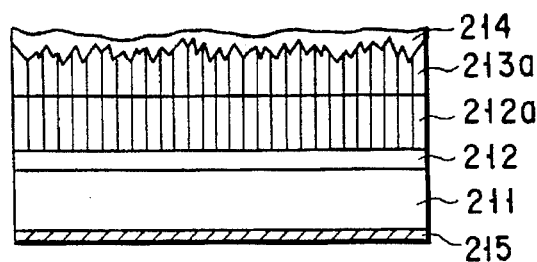
FIG. 38 is a sectional view of the semiconductor device according to the 17th embodiment of the present invention.

FIG. 38 is a sectional view showing the structure of the p-n junction of the semiconductor substrate according to the 17th embodiment of the present invention. FIGS. 39A to 39D are sectional views showing the fabrication method of this semiconductor device according to the order of the fabrication steps. This device will be described below following the order of the fabrication steps.

Figure 39A:
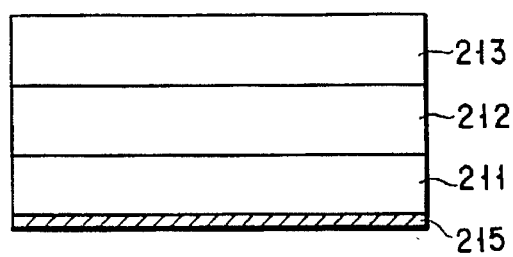
FIGS. 39A to 39D are sectional views showing the fabrication steps of the semiconductor device according to the 17th embodiment of the present invention following the order of the steps.
Figure 39B:
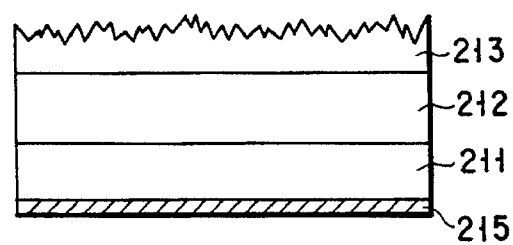
Figure 39C:
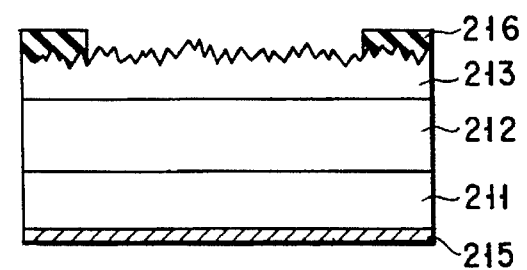
Figure 39D:
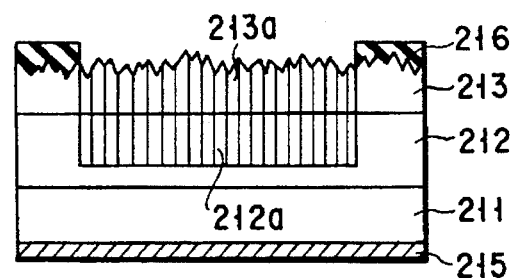

First, a $p^-$-type silicon epitaxial layer 212 is formed on a $p^+$-type silicon substrate 211, and phosphorus is thermally diffused on the layer 212 to form an $n^+$-type silicon layer 213 (FIG. 39A). In this embodiment, the surface concentration is raised to be close to the solid solution limit (>1020 $cm^{-3}$) of phosphorus, and the junction depth is set to 1.5 μm. Surface roughness is given to the surface of this substrate by polishing (FIG. 39B). More specifically, the surface is uniformly polished with a polishing material of #1000. The surface roughness is 0.1 to 0.2 μm as 10-point mean roughness defined by JIS (Japan Industrial Standard). It is important that this roughness be uniformly obtained throughout the anodized surface. If a flaw with a large amplitude partially exists, the anodization rate changes in that portion, and this results in a nonuniform structure. After the surface is cleaned, an acid-resistant mask is formed (FIG. 39C). In this embodiment an SiN film is used as the acid-resistant mask. Anodization is then performed in a solution mixture of hydrofluoric acid and ethanol. The solution composition is that ethanol is added at a volume ratio of 1.5 to 49% hydrofluoric acid. The anodization is performed in the dark by using platinum as a counter electrode. The anodization current density is set to between 200 and 300 mA/cm². Generally, with this current density an electrolytic etching mode takes place, so no porous layer is left behind. In this embodiment, however, the junction is previously formed and the surface roughness is given to the substrate. Therefore, even with this current density a uniform porous layer is formed (FIG. 39D). As discussed previously, even when a sample has a p-n junction, if the surface of the sample is a common mirror-polished surface having no surface roughness, the etching rate significantly rises in the peripheral portion. As a consequence, after anodization the surface n-type porous silicon layer peels and cracks significantly.

In the porous silicon junction structure thus formed, the internal p-type layer singly produces PL, and the surface n-type layer is nonluminescent or produces very weak PL. An ITO layer (not shown) is then formed as a charge injection layer by sputtering. In place of sputtering, a method of vapor deposition or CVD can also be used. It is also possible to form an immersion type conductive layer by thermal decomposition of an organic metal. As illustrated in FIG. 40, the voltage-current characteristic of the device thus formed exhibited a good diode characteristic. The device showed distinct luminescence with an applied voltage of 10 V or higher, and the luminescent color was uniformly orange across the injection surface. As reported by Fraunhofer-Institute mentioned earlier, in porous silicon p-n junction devices formed by conventional techniques, the emission of light is very unstable, and the light emission or the current value decreases in many instances with application of a current. In contrast, the device of the present invention was highly stable in the light emission intensity and in the current value; a change in the current value was within 5% even after current application of 10 hours or longer.

(18th Embodiment)

The device obtained by the 17th embodiment is further heat-treated at 900° C. The conditions are such that the device is held in a nitrogen atmosphere added with 10% of oxygen for one min. and subsequently held in a nitrogen atmosphere for 5 min. By this treatment, the injection current decreases by about 10% for the same applied voltage, but the light emission intensity remains substantially the same. This reason is assumed that the pore size of the porous layer is decreased by the heat treatment, and this reduces the current component in a bulk portion not contributing to the luminescence. This heat treatment is effective as long as the temperature ranges between 700° and 1100° C., preferably 800° and 950° C.

(19th Embodiment)

A p-n junction of porous silicon is formed following the same procedure as in the 17th embodiment. The surface of the sample is slightly etched by using an etching solution which is either weakly acidic or weakly alkaline. More specifically, the sample is dipped into a 5% aqueous ammonia solution for 3 sec. to etch the surface of the porous layer very slightly. Thereafter, the contact resistance is further decreased by formation of a charge injection layer. The contact is reliably held even after the heat treatment. The reason for this is considered that the ciliary, very-microstructure on the surface of the n-type porous layer is etched.

(20th Embodiment)

In this embodiment, anodization is performed by irradiation of light in the fabrication method of the 17th embodiment. Note that the light irradiation is done only for a time period needed to anodize an n-type layer, and anodization of a p-type layer is performed in the dark. Consequently, the surface n-type layer also becomes luminous after the anodization. Subsequently, a charge injection layer is formed in the same manner as discussed above, thereby completing a light-emitting device. This device shows good luminescence characteristics at small current values, although its resistance is higher than those of devices anodized in the dark. The reason for this is assumed that the wire diameter of the n-type layer is decreased to realize injection with high energy, and this makes luminescence in the interface of the p-n junction difficult to be absorbed in the surface n-type porous layer, resulting in an increased efficiency.

(21st Embodiment)

FIG. 41 is a sectional view of the semiconductor device according to the 21st embodiment of the present invention. The semiconductor device of this embodiment has a p-n junction surface formed with projections and recesses, in addition to the arrangement of the 17th embodiment. The arrangement of this device will be described below according to the order of the fabrication steps.

First, a p⁻-type silicon epitaxial layer 212 is formed on a p⁺-type silicon substrate 211, and an n⁺-type silicon layer 213 is formed on the layer 212 by thermally diffusing phosphorus. After surface roughness is given to the surface of this n⁺-type silicon layer 213 by the above-mentioned method, thermal diffusion of phosphorus is performed. In this thermal diffusion, phosphorus glass is formed, and predeposition is performed at 1200° C. for 10 min. Thereafter the phosphorus glass is removed. Consequently, the n-type layer internally diffuses into a shape reflecting the surface roughness, thereby forming a p-n junction interface 218 having projections and recesses. Following the same procedure as in the 17th embodiment, anodization is performed through the two layers, forming a porous silicon p-n junction. As illustrated in FIG. 41, in this p-n junction not only the surface of the n-type layer but also the p-n junction interface have structures reflecting the surface roughness, resulting in an increased junction interface area. This increases the injection area of the junction, thereby improving the light emission intensity.

As discussed above in the 17th to 21st embodiments, the present invention can realize porous silicon p-n junctions which are uniform, suitable for luminescence, and stable in the structure, that have been difficult to fabricate by conventional methods. Since the thickness and the microstructure of the porous layer are uniform in the direction of plane, the uniformities of the conductivity and of the luminescence in the direction of plane are improved. In addition, since the surface n-type porous layer is structurally stabilized, the durability of the device and the conductivity of the p-n junction are improved. Furthermore, the contact with the stacked charge injection layer is improved. This makes it possible to additionally perform a heat treatment at a high temperature by which no good contacts can be formed by conventional methods. Consequently, the pore size of the porous layer wire structure can be further decreased, suppressing a current not contributing to the luminescence, and improving the luminescence characteristics.

A p-n homo junction semiconductor device fabrication method will be described next. In this method, after a semiconductor serving as a light-emitting layer is made porous, this porous semiconductor is doped with an impurity, particularly an impurity whose conductivity is opposite to that of the porous semiconductor, thereby subsequently forming another porous layer.

The following various advantages can be obtained by the use of the above fabrication method by which the impurity is doped after the porous semiconductor is formed. That is, by this method it is possible to heavily dope the porous semiconductor with the impurity and to control the conductivity with respect to the band gap of the light-emitting layer. Since the series resistance of the porous layer is decreased by doping of the impurity, it is possible to obtain a high bias current with a low bias voltage when a device is fabricated using this porous layer. In addition, when a p-n junction is formed by this method, a p-n homo junction is achieved because the morphology of the porous layer in the p-type region is the same as that in the n-type region.

Diffusing an impurity into a porous layer requires high-temperature annealing. Unfortunately, high-temperature annealing changes the porous micro-structure and increases the density of dangling bonds on the semiconductor surface. This consequently makes the porous semiconductor nonluminescent. In the method of the present invention, however, after a dopant is thermally diffused into a porous semiconductor, anodization is again executed. As a consequence, a new light-emitting layer is formed, the surface of the nonluminescent porous layer is chemically etched, and the dangling bonds are terminated. The result is a porous semiconductor capable of emitting visible light. This makes it possible to provide a p-n homo junction light-emitting device which has a low resistance, a high carrier injection efficiency, and stable luminescence characteristics.

Semiconductor devices fabricated by the above method will be described in detail below in the 22nd and 23rd embodiments.

(22nd Embodiment)

Figure 42:
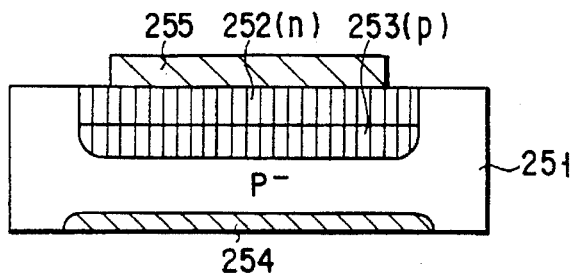
FIG. 42 is a sectional view of the semiconductor device according to the 22nd embodiment of the present invention.

FIG. 42 is a sectional view of the semiconductor device according to the 22nd embodiment of the present invention. In FIG. 42, reference numeral 251 denotes a p-type silicon substrate with an impurity concentration of $10^{15}$ to $10^{16}$ cm$^{-3}$; 252, a porous silicon layer formed by making the silicon substrate 251 porous and converting the conductivity type to n-type by impurity doping; and 253, a p-type porous silicon layer formed by anodizing the silicon substrate 251. A p-n homojunction is formed between the n-type porous silicon layer 252 and the p-type porous silicon layer 253. Reference numeral 254 denotes a lower electrode formed by doping an impurity into the lower surface of the silicon substrate 251; and 255, a transparent electrode, e.g., an ITO transparent conductive film.

This device showed strong rectification properties and started to emit visible orange light when the bias voltage exceeded about 1.5 V. The emission of light was obtained from the entire surface of the transparent electrode, so the luminescence characteristics were stable. The bias current was approximately 50 mA for a bias voltage of 7 V, i.e., the series resistance was greatly reduced. Also, the device did not significantly generate heat even when applied with the voltage for long periods of time.

FIGS. 43A to 43K are sectional views showing the fabrication process of the semiconductor device of this embodiment according to the order of the fabrication steps. The process will be described below following the order of the drawings.

Figure 43A:
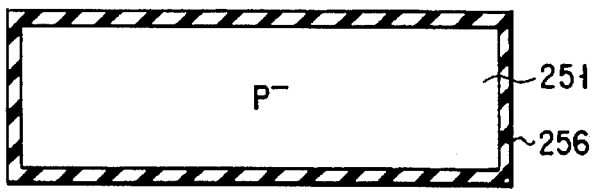
FIGS. 43A to 43K are sectional views showing the fabrication steps of the semiconductor device according to the 22nd embodiment of the present invention following the order of the steps.
Figure 43B:
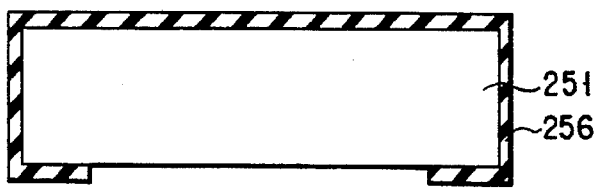

A B-doped, p-type 5-inch CZ-type silicon substrate with a specific resistance of 9 to 10 Ω.cm, a major surface orientation of (100), and a thickness of 500 μm is used as the substrate 251. After the silicon substrate is diced into squares of 15 mm side, cleaning using a neutral cleaner, organic cleaning (three-step cleaning using acetone, methylene chloride, and acetone), and acid. alkali cleaning (RCA cleaning) are performed. A natural oxide film on the substrate is removed by dilute hydrofluoric acid, and mask oxidation is performed to form a silicon oxide film 257 (FIG. 43A). The mask oxidation is done in water vapor at 1100° C. for 90 min.

Figure 43C:
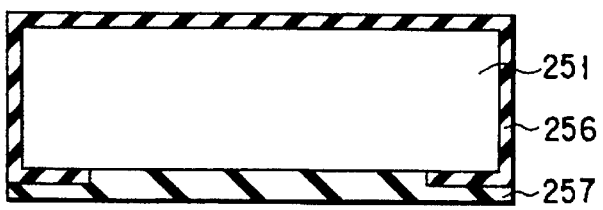
Figure 43D:
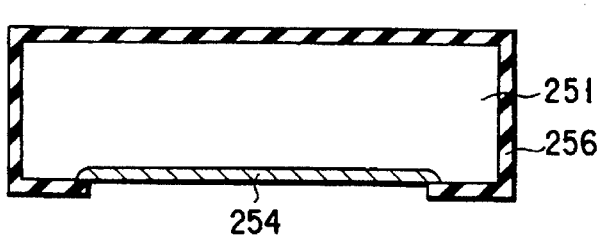

A portion of a mask oxide film 256 corresponding to a lower electrode formation region (a square of about 12 mm side) on the lower surface of the substrate 251 is etched with dilute hydrofluoric acid (HF:H$_2$O=1:10). Subsequently, organic cleaning and acid. alkali cleaning (RCA cleaning) are performed. A natural oxide film is then etched with dilute hydrofluoric acid, and acetone cleaning is done. PBF (tradename: manufactured by TOKYO OHKA KOGYO CO., LTD.) as a liquid boron diffusing agent 257 is spin-coated (5000 rpm, 5 sec.) (FIG. 43C). The organic component of the PBF is evaporated by baking (140° C., 30 min.), and predeposition is performed at 1200° C. for 20 min. with gas flow rates of O$_2$:N$_2$=50 ml:1000 ml. Lastly, boron glass is removed by dilute hydrofluoric acid (HF:H$_2$O=1:10), and a P$^{++}$-type electrode 254 is formed (FIG. 43D).

Figure 43E:
Figure 43F:
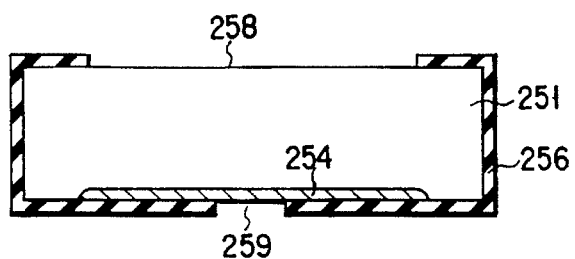

Subsequently, mask oxidation (1100° C., 90 min., in water vapor) is again performed (FIG. 43E). The oxide film on a porous silicon formation region 258 (a square of about 12 mm side) on the surface and the oxide film on an anodization electrode region 259 (about 3 mm×10 mm) below the region 258 are etched away by hydrofluoric acid (FIG. 43F). A lead (not shown) is fixed as an anodization extracting electrode to the electrode region 259. The overall porous silicon formation region 258 excluding the substrate surface is covered with an acid-resistant tape, and this substrate surface is cleaned with ethanol.

Figure 43G:
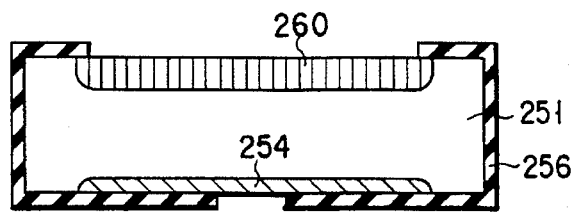

Formation of porous silicon is performed by irradiation of light in a hydrofluoric acid solution (49% HF:99% C$_2$H$_5$OH=2:3) by using the silicon substrate as an anode and a platinum counter electrode as a cathode. Anodization is performed using a constant-current voltage source at a current density of 10 to 20 mA/cm$^2$ while monitoring the current. The anodization time is 5 to 40 min. Consequently, a p-type porous silicon layer 260 is formed with a thickness of a few micrometers to a few tens of micrometers (FIG. 43G).

Figure 43H:
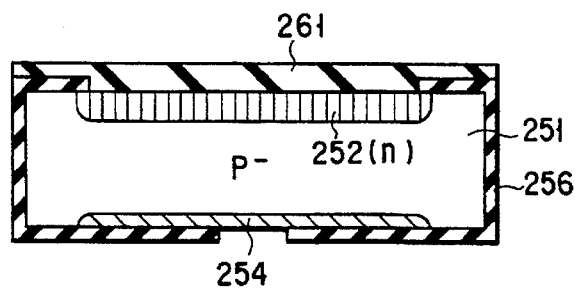
Figure 43I:
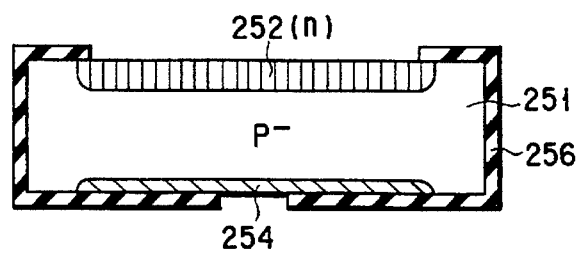

The conductivity type of the porous silicon layer 260 is then converted into n-type. For the purpose, the sample is ultrasonically cleaned with acetone, and OCD (tradename: manufactured by TOKYO OHKAKOGYO CO., LTD.) as a liquid phosphorus diffusing agent 261 is spin-coated on the sample (5000 rpm, 15 sec.). The sample is baked at 140° C. for 30 min. (FIG. 43H). Subsequently, predeposition is performed with gas flow rates of O$_2$:N$_2$=50 ml: 1000 ml. Consequently, thermal diffusion is done into the porous silicon layer 260, forming an n-type porous silicon layer 252 (FIG. 43I). This predeposition is performed at 860° C. for a short time period of 10 min. The predeposition time is short since the porous silicon takes a fine sponge structure consisting of coles and pores having diameters from a few nanometers to a few tens of micrometers, so it is considered that the diffusing agent penetrates into the porous silicon through these pores and as a result the diffusion proceeds faster than in normal bulk silicon substrates. Note that PL vanishes completely after the heat treatment. This is so because dangling bonds and the Pb center defect density in the Si/SiO$_2$ interface are increased by a heat treatment at 300° C. or higher, and this suppresses the nonluminescent component. Thereafter, phosphorus glass is removed by dilute hydrofluoric acid (HF:H$_2$O=1:10).

Figure 43J:
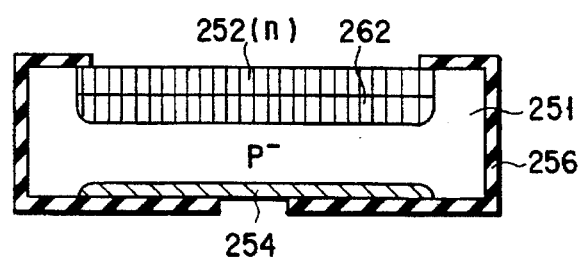
Figure 43K:
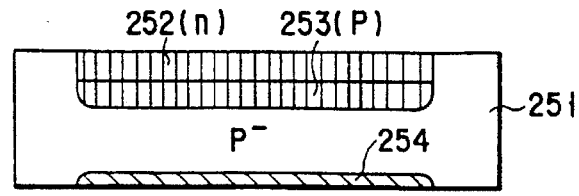

Subsequently, a p-type porous layer 262 is formed to form a p-n junction of the porous silicon (FIG. 43J). After the mask oxide film 256 is etched with hydrofluoric acid, the sample is so covered with an acid-resistant tape that an opening is formed only in the n-type porous silicon layer 252, and anodization is performed to form a p-type porous silicon layer 253 (FIG. 43K). The anodization is first done with a current of 15 mA for 5 to 30 min. under room illumination and then performed for 5 to 30 min. while irradiating light. Although no visible PL was attained after the anodization under room illumination, bright PL was obtained after the anodization with irradiation of light. The reason for this is considered that the dangling bonds in the n-type layer are terminated with H and OH by the heat treatment and that a newly formed p-type porous layer itself emits light. Note that if the anodization under room illumination is omitted in the formation of the p-type porous layer, a nonuniform porous layer is formed.

Lastly, an ITO transparent conductive film is vapor-deposited on the n-type layer to form the upper electrode 255, completing the semiconductor device (FIG. 42). The sputtering is performed for 120 min. while heating the substrate at a pressure of 23 μHg, gas flow rates of Ar:$O_2$=20 sccm: 1 sccm, power of 110 W, and a temperature of 250° C.

In this embodiment, a liquid source is used in impurity diffusion to the porous silicon. However, gas sources such as $B_2H_6$ and $PH_3$ or solid sources such as BN and $P_2O_5$ can also be used. Ion implantation also is usable. In other embodiments, phosphorus was ion-implanted into porous silicon with a dose of $2\times10^{15}$ cm$^{-2}$. After the ion implantation, visible luminescence of the porous silicon was largely decreased. It turned out that this decrease in the visible luminescence was caused because the dose of the ion implantation was too high and this made the porous silicon surface amorphous. After the porous amorphous silicon was removed, the porous silicon again emitted visible light. When the porous silicon having the amorphous surface was annealed at 800° C. for 20 min. to thereby activate phosphorus and anodization was again performed, no visible luminescence was obtained. This is so because in ion implantation to silicon of the substrate the recrystallization of an amorphous substance takes place upon annealing since the underlying silicon crystal serves as a seed crystal, but this phenomenon does not occur in porous silicon. ITO electrodes were vapor-deposited on these devices, and it was found that the light emission intensity of the resultant devices was very low. This is because the junction was a p-n heterojunction in which the n-type amorphous silicon, the surface of the light-emitting layer of which was made amorphous by ion implantation, was formed on the p-type porous silicon, particularly because the amorphous silicon was nonluminescent. After the ion implantation, a high-temperature heat treatment is required to activate the implanted ions and to recover regions damaged by the implantation or the mass of disorder. By this annealing the bonds of hydrogen, a hydroxyl group, and oxygen are broken, and dangling bonds are formed. This also is the cause of a decrease in the light emission intensity. To prevent porous silicon from being made amorphous, the appropriate phosphorus dose is $10^{15}$ cm$^{-2}$ or less.

Figure 44:
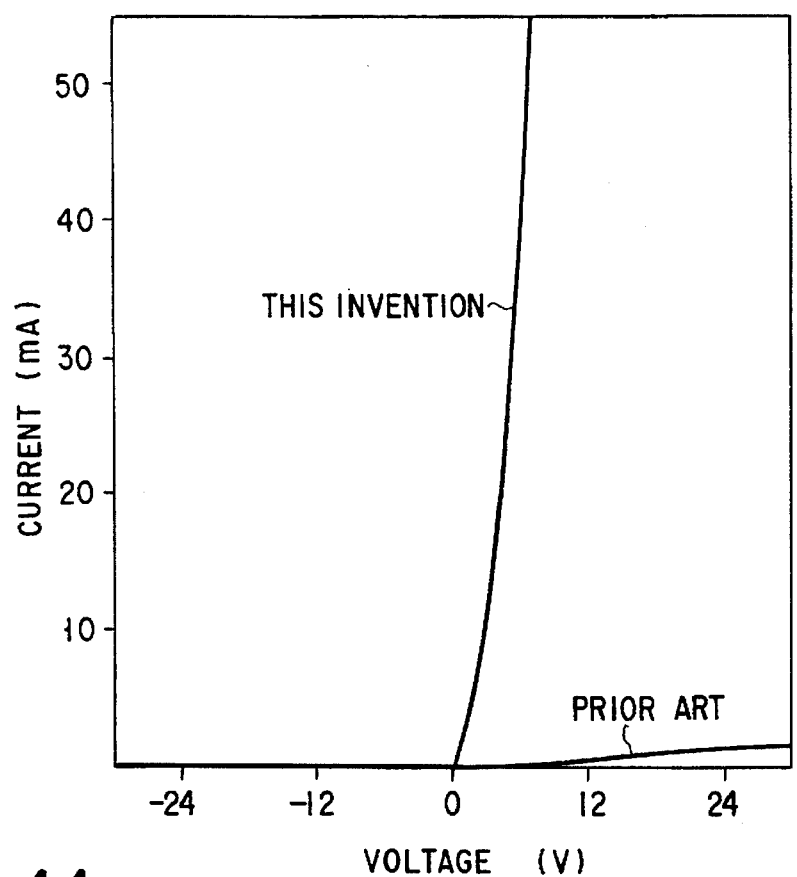
FIG. 44 is a graph showing the diode characteristic of the 22nd embodiment of the present invention in comparison with the characteristic of one prior art.

FIG. 44 is a graph showing the current-voltage characteristics of the p-n homo junction light-emitting device fabricated according to FIGS. 43A to 43K and of a conventional device. As in FIG. 44, the device resistance for a voltage in the forward direction of 5 V of the device of this embodiment was 1/682 of that of the conventional heterojunction device. The rectification ratio of the device of this embodiment was also about 5 times that of the conventional device.

Incidentally, the p-n homo junction in this embodiment is formed by performing anodization twice. However, p-n homo junction can also be formed by varying the anodization conditions and controlling the diameter of the pores to vary the diffusion depth of the dopant. For example, a deep diffusion depth can be obtained by using $P^{++}$-type silicon substrate, and a shallow diffusion depth obtained by $p^-$-type silicon substrate. Furthermore, diffusion depth can be controlled by varying the viscosity of the liquid impurity source, thus varying the immersion depth thereof into pores.

(23rd Embodiment)

Figure 45A:
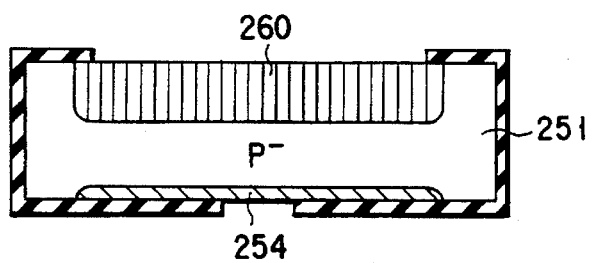
FIGS. 45A to 45C are sectional views showing the fabrication steps of the semiconductor device according to the 23rd embodiment of the present invention following the order of the steps.
Figure 45B:
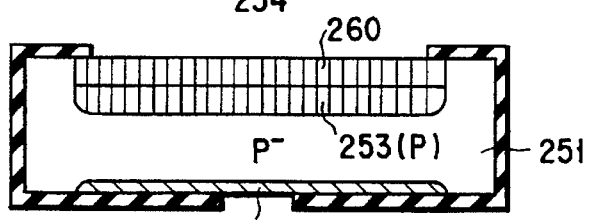
Figure 45C:
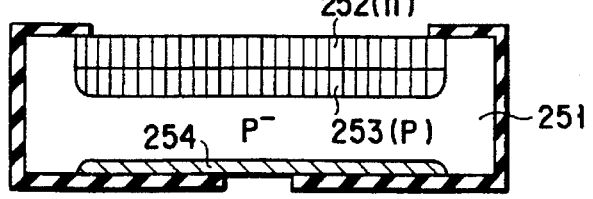

The arrangement of the completed semiconductor device according to the 23rd embodiment of the present invention is analogous to that of the semiconductor device of the 22nd embodiment. Therefore, the semiconductor device of the 23rd embodiment will be described with reference to FIG. 42, and only specific parts in the fabrication steps are illustrated in FIGS. 45A to 45C. In FIGS. 45A to 45C, the same reference numerals as in the 22nd embodiment denote the same parts.

In this embodiment a B-doped, p-type silicon substrate 251 with a specific resistance of 10 Ω.cm and a major surface orientation of (100) is used. The substrate 251 is anodized in a hydrofluoric acid solution (5 to 25% hydrofluoric acid+10 to 50% ethanol) by using platinum as a counter electrode, forming porous silicon 260 about 7 μm in thickness (FIG. 45A). The anodization is done at a current density of 20 mA/cm$^2$ for 5 min. while irradiating light. The porosity was approximately 50 to 70%. Subsequently, B is diffused into the porous silicon by ion implantation. The acceleration energy is about 1000 to 4000 keV. Consequently, B is diffused by multiple implantation with a dose of $10^{14}$/cm$^2$ in a region from the surface of the porous silicon to a depth of about 3 to 7 μm to form a p-type porous silicon layer 253 (FIG. 45B). Note that when the acceleration energy is 1000 keV, the implantation distance is about 7 μm and the implantation distribution is about 0.3 μm. P is then diffused with a dose of $10^{14}$/cm$^2$. The diffusion was done at an acceleration energy of 700 to 1000 keV, and the conductivity type of a layer from the surface to a depth of about 3 μm was converted into n-type. As a consequence, an n-type porous silicon layer 252 is formed, and a p-n junction is formed between the layer 252 and the p-type porous silicon layer 253 (FIG. 45C). A step p-n junction is realized, in this manner, by doping the n-type and p-type impurities at high concentrations into the porous silicon. Subsequently, the impurities are activated by annealing at a temperature of 900° C. and gas flow rates of $N_2$:$O_2$=20 ml/min.: 50 ml/min. for 20 min. After the formation of the p-n junction, an ITO transparent electrode 255 is vapor-deposited to have a film thickness of about 300 nm. The sputtering conditions are such that the gas flow rates are Ar: $O_2$=20 sccm: 1 sccm, the RF voltage is 1.3 kV, the current is 120 mA, the power is 100 W, and the chamber internal pressure is 15 μtorr.

An anodization voltage was applied to the ITO electrode 255 of the resultant device. Consequently, the device exhibited rectification properties; the device resistance decreased to about 1/1000 that before the doping. The device started to emit visible light having a peak intensity at approximately 700 nm when the applied voltage exceeded about 2.5 V, and the light emission intensity increased with increasing current. Also, the emission of light was stable.

As discussed above, in the semiconductor devices according to the 22nd and 23rd embodiments, the electrical resistance is reduced significantly since impurities are doped after the formation of the porous semiconductor. This decreases the driving voltage of the device and consequently increases the energy efficiency. Additionally, a p-n homo junction device can be accomplished because a p-type layer is formed after the formation of an n-type layer. Since this improves the luminescence characteristics and the electrical characteristics, a semiconductor light-emitting device having stable luminescence characteristics can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a porous silicon layer made from single crystalline silicon as a base with an impurity concentration of $1\times10^{19}$ to $1\times10^{21}$ cm$^{-3}$, in which a plurality of pores are formed; and a thermal oxide film of 0.01 to 10 µm thickness, formed on expanded surfaces of said porous silicon layer, said expanded surfaces including internal surfaces of said pores.

2. A semiconductor device comprising:

a silicon substrate having a major surface;

a first porous silicon layer of a first conductivity type with an impurity concentration of $1\times10^{19}$ to $1\times10^{21}$ cm$^{-3}$, which is formed on the major surface of said silicon substrate, and in which a plurality of pores are formed;

a second porous silicon layer of a second conductivity type with an impurity concentration of $1\times10^{19}$ to $1\times10^{21}$ cm$^{-3}$, in which a plurality of pores are formed and which are formed on said first silicon layer to form a p-n junction with said first silicon layer; and a thermal oxide film 0.01 to 10 µm thick formed on expanded surfaces of said first and said second porous silicon layers said expanded surfaces including internal surfaces of said pores; and an electrode selectively formed on said second porous silicon layer of the second conductivity type.

3. A device according to claim 2, wherein said electrode is essentially a transparent electrode, and said p-n junction has a luminescent function.

4. A device according to claim 2, wherein said second silicon layer of the second conductivity type are formed by making the major surface of said substrate of the first conductivity type porous, and by doping an impurity of the second conductivity type into upper portions of said second silicon layer, the remaining portions of said first silicon layer of the first conductivity type forming said p-n junction with said second silicon layer of the second conductivity type.

5. A semiconductor device comprising:

a substrate having a major surface;

a porous silicon layer with an impurity concentration of $1\times10^{19}$ to $1\times10^{21}$ cm$^{-3}$, which is formed on the major surface of said silicon substrate, and in which a plurality of pores are formed;

a thermal oxide film 0.01 to 10 µm thick formed on expanded surfaces of said porous silicon layer, said expanded surfaces including internal surfaces of said pores; and an electrode selectively formed on said porous silicon layer, in order to form an ohmic junction with said porous silicon layer.

6. A device according to claim 5, wherein said electrode is essentially a transparent electrode, and said ohmic junction has a luminescent function.

7. A device according to claim 6, wherein said electrode is a transparent electrode consisting of an ITO (Indium Tin Oxide) film.

8. A semiconductor device comprising:

a substrate having a major surface;

a porous silicon layer with an impurity concentration of $1\times10^{19}$ to $1\times10^{21}$ cm$^{-3}$, which is formed on the major surface of said silicon substrate, and in which a plurality of pores are formed;

a thermal oxide film 0.01 to 10 µm thick formed on expanded surfaces of said porous silicon layer said expanded surfaces including internal surfaces of said pores; and an electrode selectively formed on said porous silicon layer, in order to form a Schottky junction with said porous silicon layer.

9. A device according to claim 8, wherein said electrode is essentially a transparent electrode, and said Schottky junction has a luminescent function.

* * * * *